United States Patent
Gilmore et al.

(10) Patent No.: US 10,794,866 B2
(45) Date of Patent: Oct. 6, 2020

(54) ACOUSTIC WAVE SENSORS AND METHODS OF SENSING A GAS-PHASE ANALYTE

(71) Applicants: Rohm and Haas Electronic Materials LLC, Marlborough, MA (US); Rohm and Haas Electronic Materials Korea Ltd., Cheonan (KR)

(72) Inventors: Christopher Gilmore, Natick, MA (US); Aaron A. Rachford, South Grafton, MA (US); Hee Jae Yoon, Seoul (KR); Jaclyn Murphy, Ashland, MA (US); Peter Trefonas, III, Medway, MA (US); Deyan Wang, Hudson, MA (US)

(73) Assignees: Rohm and Haas Electronic Materials LLC, Marlborough, MA (US); Rohm and Haas Electronic Materials Korea Ltd., Seoul (KR)

( * ) Notice: Subject to any disclaimer, the term of this patent is extended or adjusted under 35 U.S.C. 154(b) by 0 days.

(21) Appl. No.: 16/242,395

(22) Filed: Jan. 8, 2019

(65) Prior Publication Data

US 2019/0219543 A1 Jul. 18, 2019

Related U.S. Application Data

(60) Provisional application No. 62/617,324, filed on Jan. 15, 2018.

(51) Int. Cl.
*G01N 29/036* (2006.01)
*G01N 29/02* (2006.01)
(Continued)

(52) U.S. Cl.
CPC ......... *G01N 29/036* (2013.01); *C08F 232/06* (2013.01); *C08F 238/00* (2013.01);
(Continued)

(58) Field of Classification Search
CPC ...... C08F 232/06; C08F 238/00; C08L 39/04; C08L 79/08; G01N 2291/014;
(Continued)

(56) References Cited

U.S. PATENT DOCUMENTS 6,156,578 A 12/2000 Glenn
6,171,867 B1 1/2001 Feucht et al.
(Continued)

FOREIGN PATENT DOCUMENTS

CN 102937624 A 10/2012
JP 11218512 A 8/1999
(Continued)

OTHER PUBLICATIONS

Search report for corresponding Taiwan Application No. 107147702 dated Jul. 31, 2019.
(Continued)

*Primary Examiner* — Francis C Gray
(74) *Attorney, Agent, or Firm* — Jonathan D. Baskin

(57) ABSTRACT

Acoustic wave sensors comprise: a piezoelectric layer, first and second electrodes arranged with the piezoelectric layer in a piezoelectric transducer circuit; and a polymeric sensing layer for adsorbing a gas-phase analyte, the adsorption of which analyte causes a change in resonant frequency of the piezoelectric transducer circuit, wherein the polymeric sensing layer comprises: (a) a polymer chosen from substituted or unsubstituted: polyarylenes comprising the reaction product of monomers comprising a first monomer comprising an aromatic acetylene group and a second monomer comprising a cyclopentadienone group; polyamides; polypyrazoles; or novolacs; or a cured product thereof; (b) a polymer chosen from substituted or unsubstituted: polyamic acids; or polyamic acid-polyimide copolymers; (c) a polymer formed from one or more monomers comprising a monomer com-
(Continued)

prising a polar group-substituted arylcyclobutene group, or a cured product thereof; or (d) a polymer comprising polymerized units of a monomer chosen from substituted or unsubstituted: maleimides; or norbornenes; or a cured product thereof. The acoustic wave sensors and methods of using such sensors find particular applicability in the sensing of gas-phase analytes.

16 Claims, 4 Drawing Sheets

(51) Int. Cl.
    *C08F 232/06*     (2006.01)
    *C08F 238/00*     (2006.01)
    *C08L 39/04*     (2006.01)
    *C08L 79/08*     (2006.01)
    *G01N 29/22*     (2006.01)
    *G01N 29/36*     (2006.01)
    *H01L 41/113*     (2006.01)

(52) U.S. Cl.
CPC .............. *C08L 39/04* (2013.01); *C08L 79/08* (2013.01); *G01N 29/022* (2013.01); *G01N 29/223* (2013.01); *G01N 29/36* (2013.01); *H01L 41/1132* (2013.01); *G01N 2291/014* (2013.01); *G01N 2291/0215* (2013.01); *G01N 2291/0255* (2013.01); *G01N 2291/0256* (2013.01); *G01N 2291/0257* (2013.01); *G01N 2291/0423* (2013.01); *G01N 2291/0426* (2013.01)

(58) Field of Classification Search
CPC ... G01N 2291/0215; G01N 2291/0255; G01N 2291/0256; G01N 2291/0257; G01N 2291/0423; G01N 2291/0426; G01N 29/022; G01N 29/036; G01N 29/223; G01N 29/36; H01L 41/1132
See application file for complete search history.

(56) References Cited

U.S. PATENT DOCUMENTS

| | | | |
|---|---|---|---|
| 6,357,278 B1* | 3/2002 | Sivavec | G01N 29/022 |
| | | | 252/408.1 |
| 6,902,701 B1 | 6/2005 | Hughes et al. | |
| 7,837,844 B2 | 11/2010 | Patel et al. | |
| 7,993,584 B1* | 8/2011 | Kim | G01G 3/16 |
| | | | 422/50 |
| 8,624,465 B2 | 1/2014 | Do et al. | |
| 9,329,154 B1 | 5/2016 | Allendorf et al. | |
| 2003/0004426 A1* | 1/2003 | Melker | G01N 29/022 |
| | | | 600/532 |
| 2005/0016276 A1 | 1/2005 | Guan et al. | |
| 2006/0032290 A1* | 2/2006 | Liu | G01N 29/326 |
| | | | 73/29.02 |
| 2006/0292033 A1* | 12/2006 | Blok | G01N 27/126 |
| | | | 422/504 |
| 2007/0190662 A1 | 8/2007 | Baetzold et al. | |
| 2007/0258894 A1* | 11/2007 | Melker | G01N 33/497 |
| | | | 424/9.1 |
| 2011/0157593 A1 | 6/2011 | Miyadera et al. | |
| 2012/0183949 A1* | 7/2012 | Hyde | A61M 11/001 |
| | | | 435/5 |
| 2015/0210793 A1 | 7/2015 | Park et al. | |
| 2016/0231267 A1* | 8/2016 | Swager | G01N 27/127 |

FOREIGN PATENT DOCUMENTS

| | | |
|---|---|---|
| JP | 04565092 B2 | 10/2010 |
| KR | 2016001369 A | 1/2016 |
| WO | 2007114192 A1 | 10/2007 |

OTHER PUBLICATIONS

Search report for corresponding Europe Application No. 19 15 1288 dated May 23, 2019.
Bender, et al., "Acoustic wave-based sensors using mode conversion in periodic gratings", IEEE Transactions on Ultrasonics, Ferroelectrics and Frequency Control, Nov. 1999, pp. 1497-1503, vol. 46, No. 6.
Dahint, et al, "On the the mass sensitivity of acoustic plate mode sensors", The 8th International Conference on Solid-State Sensors and Actuators and Eurosensors IX, Jun. 25-29, 1995, pp. 758-760.
Lin, et al., "Explosive trace detection with FBAR-Based Sensor", 2008 IEEE 21st International Conference on Micro Electro Mechanical Systems, 2008, pp. 208-211.
Liu et al, "BCB film based SAW humidity sensor", Electronic Letters, Sep. 1, 2011, vol. 47, No. 18.
Korotcenkov, et al, Integrated Analytical Systems, Handbook of Gas Sensor Materials: Properties, Advantages and Shortcomings for Applications vol. 1, Conventional Approaches, Integrated Analytical Systems, 2013, Chapter 3 entitled "Polymers" and 13 entitled "Materials for Piezoelectric-based Gas Sensors".
Grate, et al, "Method for estimating polymer-coated acoustic wave vapor sensor responses", Anal. Chem. 1995, pp. 2162-2169, vol. 67.
Toal, et al, "Polymer sensors for nitroaromatic explosives detection", J. Mater. Chem., 2006, pp. 2871-2883, vol. 16.
Ballantine et al, "Chemical and Biological Sensors", Acoustic Wave Sensors Theory, Design, and Physico-Chemical Applications, Chapter 5 pp. 222-330 and Appendix C, pp. 421-427, Polymer Materials, Academic Press (1997).

* cited by examiner

US 10,794,866 B2

ACOUSTIC WAVE SENSORS AND METHODS OF SENSING A GAS-PHASE ANALYTE

FIELD

The invention relates generally to sensors for sensing an analyte. More specifically, this invention relates to acoustic wave sensors that include a polymeric sensing layer, and to methods for sensing an analyte using such sensors. The acoustic wave sensors and sensing methods have particular applicability in the sensing of gas- and vapor-phase analytes.

BACKGROUND OF THE INVENTION

The detection of gas-phase analytes is important for various applications in both industrial and consumer market sectors. Gas sensors have been used, for example, in the detection of toxic and flammable gases and vapors (collectively gases), in the monitoring and control of vacuum deposition processes for coating thickness measurement and in humidity monitoring. Interest in gas sensors has recently expanded to the consumer electronics market, for example, to mobile, Internet of Things (IoT) and wearables applications.

One class of gas sensors is the piezoelectric-based (or acoustic wave) gas sensor which includes, for example, bulk acoustic wave (BAW) sensors such as quartz-crystal microbalance (QCM) and film bulk acoustic resonator (FBAR) sensors, and surface acoustic wave (SAW) sensors. Such sensors typically include a piezoelectric layer in which acoustic waves are generated with an intrinsic acoustic resonant frequency. The piezoelectric material can be coated with a sensing material such as a polymer, metal, metal oxide, silica or other inorganic composite material that is sorptive for an analyte of interest. Sensing of the analyte occurs as a result of an alteration in a characteristic of the path traveled by the acoustic waves, leading to a change in wave velocity and resonant frequency. Such alteration is a function of a change in one or more properties of the sensing material, for example, one or more of mass loading, viscosity, viscoelasticity, elastic stiffness, electrical conductivity or permittivity, with mass loading being most typical. For example, with an increase in mass loading from adsorbed analyte, a decreased wave velocity and resonant frequency results as compared with an analyte-free sensing layer. A process of transduction is carried out by which the input (e.g., resonant frequency or wave velocity) is converted to a measurable output, which is typically an electrical signal, by piezoelectric effect.

The sorption mechanism of sensing materials to analytes in some cases can result in an irreversible modification of the sensing material which can result in decreased sensitivity in future analyte exposure. U.S. Pat. No. 6,171,867 B1, for example, discloses a sensor comprising a piezoelectric crystal with a polyarylene thioether-containing coating. This patent discloses that the sensor is suitable for the detection of ozone, halogens and peroxide-containing compounds. It is believed, however, that the aforementioned analytes would form covalent bonds via oxidative chemical reaction with the polyarylene thioether-containing coating, making desorption of the analyte and subsequent reuse of the sensor difficult or impossible. It would therefore be desirable to provide a sensor in which the sensing material can adsorb and reversibly desorb a gas-phase analyte of interest in a practical manner. It would be particularly useful if the sensor could reversibly desorb the gas-phase analyte within a short time period, for example, less than 60 minutes or less than 10 minutes.

There is a continuing need for improved acoustic wave sensors and methods of sensing a gas-phase analyte.

SUMMARY OF THE INVENTION

In accordance with a first aspect of the invention, acoustic wave sensors are provided. The acoustic wave sensors comprise: a piezoelectric layer; first and second electrodes arranged with the piezoelectric layer in a piezoelectric transducer circuit; and a polymeric sensing layer for adsorbing a gas-phase analyte, the adsorption of which analyte causes a change in resonant frequency of the piezoelectric transducer circuit, wherein the polymeric sensing layer comprises: (a) a polymer chosen from substituted or unsubstituted: polyarylenes comprising the reaction product of monomers comprising a first monomer comprising an aromatic acetylene group and a second monomer comprising a cyclopentadienone group; polyamides; polypyrazoles; or novolacs; or a cured product thereof; (b) a polymer chosen from substituted or unsubstituted: polyamic acids; or polyamic acid-polyimide copolymers; (c) a polymer formed from one or more monomers comprising a monomer comprising a polar group-substituted arylcyclobutene group, or a cured product thereof; or (d) a polymer comprising polymerized units of a monomer chosen from substituted or unsubstituted: maleimides; or norbornenes; or a cured product thereof. The acoustic wave sensors and methods of using such sensors find particular applicability in the sensing of gas-phase analytes.

In accordance with a further aspect of the invention, methods of sensing a gas-phase analyte are provided. The methods comprise: (a) providing an acoustic wave sensor as described herein; (b) exposing the polymeric sensing layer to an atmosphere comprising a gas-phase analyte; and (c) monitoring resonant frequency of the acoustic wave sensor in response to the presence of the gas-phase analyte on the polymeric sensing layer.

BRIEF DESCRIPTION OF THE DRAWINGS

The present invention will be described with reference to the following drawings, in which like reference numerals denote like features, and in which.

DETAILED DESCRIPTION OF THE INVENTION

Figure 1:
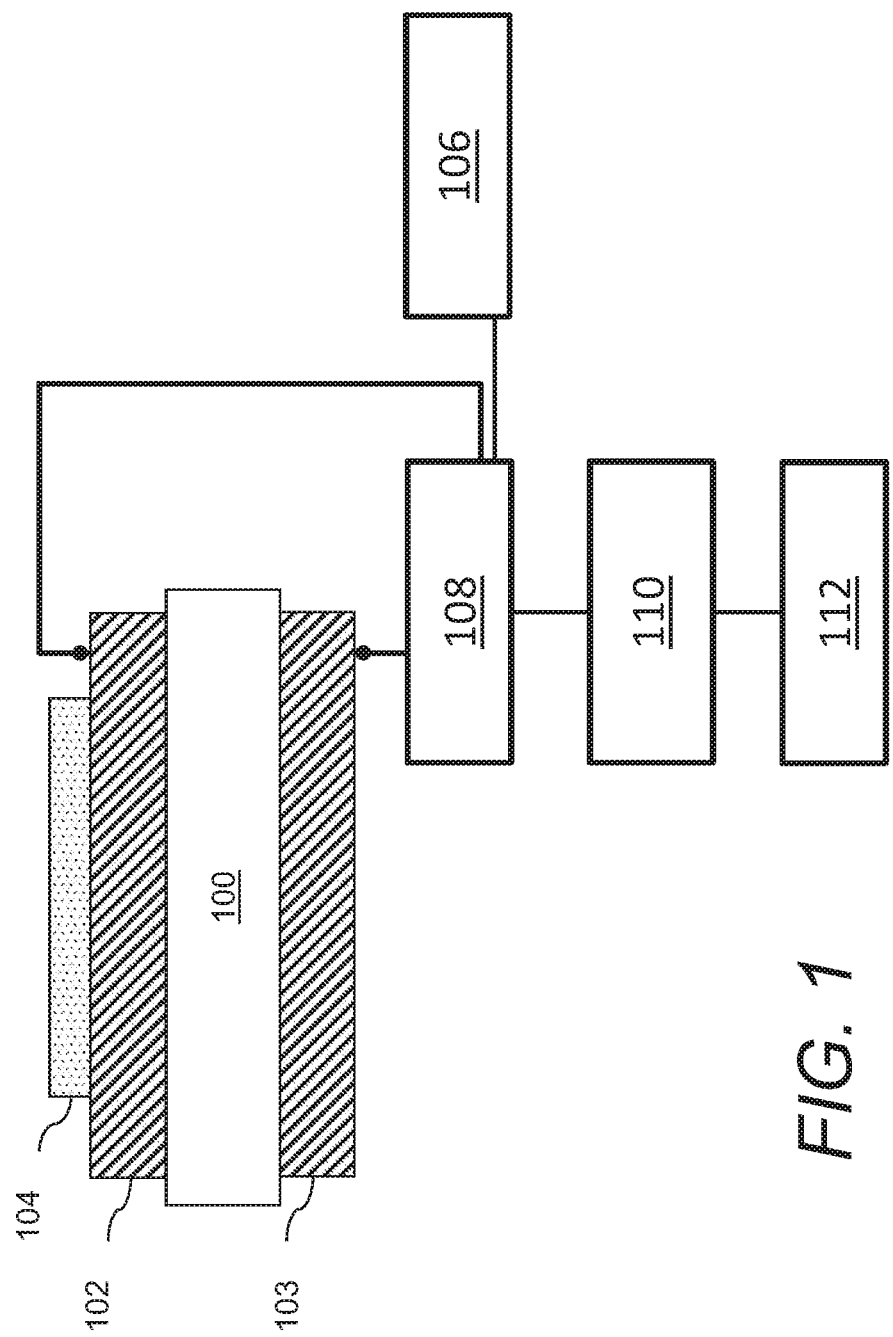
FIG. 1 illustrates in cross-section a quartz crystal microbalance sensor in accordance with the invention.

Acoustic wave sensors of the invention include a piezoelectric layer, first and second electrodes arranged with the piezoelectric layer in a piezoelectric transducer circuit, and a polymeric sensing layer for adsorbing a gas-phase analyte. Adsorption of the gas-phase analyte on the polymeric sensing layer causes a change in resonant frequency of the piezoelectric transducer circuit. Such change in resonant frequency can be correlated to the content of adsorbed analyte on the polymeric layer. Suitable acoustic wave sensors of the invention include, for example, bulk acoustic wave sensors such as quartz crystal microbalance (QCM) sensors and film bulk acoustic resonator sensors, and surface acoustic wave sensors.

The polymeric sensing layer comprises a sensing polymer. The sensing polymer is: (a) a polymer chosen from substituted or unsubstituted: polyarylenes comprising the reaction product of monomers comprising a first monomer comprising an aromatic acetylene group and a second monomer comprising a cyclopentadienone group; polyamides; polypyrazoles; or novolacs; or a cured product thereof; (b) a polymer chosen from substituted or unsubstituted: polyamic acids; or polyamic acid-polyimide copolymers; (c) a polymer formed from one or more monomers comprising a monomer comprising a polar group-substituted arylcyclobutene group, or a cured product thereof or (d) a polymer comprising polymerized units of a monomer chosen from substituted or unsubstituted: maleimides; or norbornenes; or a cured product thereof.

As used herein, "substituted" means including at least one substituent such as a halogen, (i.e., F, Cl, Br, I), hydroxyl, amino, thiol, nitrile, nitro, carboxyl, carbonyl, carboxamide, ether, ester, carbonate ester, sulfonyl, sulfinyl, $C_{1-30}$ alkyl, $C_{2-30}$ alkenyl, $C_{7-30}$ aralkyl, $C_{6-30}$ aryl, $C_{4-30}$ heteroaryl, —OR, —$C_{1-30}$ alkylene-OR, or —$C_{1-30}$ alkylidene-OR; wherein R is chosen, for example, from H, $C_{1-30}$ alkyl, $C_{2-30}$ alkenyl, $C_{6-30}$ aryl, or $C_{4-30}$ heteroaryl. Typically, the substituents are chosen, for example, from fluorine, $C_{1-20}$ alkyl, $C_{2-20}$ alkenyl, $C_{7-30}$ aralkyl, $C_{6-20}$ aryl, $C_{4-20}$ heteroaryl, —OR, —$C_{1-20}$ alkylene-OR, or —$C_{1-20}$ alkylidene-OR; and more typically from fluorine, $C_{1-10}$ alkyl, $C_{2-12}$ alkenyl, $C_{7-30}$ aralkyl, $C_{6-20}$ aryl, $C_{4-20}$ heteroaryl, —OR, —$C_{1-20}$ alkylene-OR, or —$C_{1-20}$ alkylidene-OR. R is typically chosen from H, $C_{1-20}$ alkyl, $C_{2-20}$ alkenyl, $C_{6-20}$ aryl, or $C_{4-20}$ heteroaryl, more preferably H, $C_{1-10}$ alkyl, $C_{6-20}$ aryl, or $C_{4-20}$ heteroaryl, and most typically H. It will be understood that any group or structure disclosed with respect to the formulas herein may be so substituted unless otherwise specified, or where such substitution would significantly adversely affect the desired properties of the resulting structure. As used herein, "heteroaryl" refers to an aromatic ring system containing at least one heteroatom selected from nitrogen, oxygen, and sulfur. Preferably, the heteroaryl group is a five or six-membered ring.

When a group containing a specified number of carbon atoms is substituted with another group, the number of carbon atoms in the resulting "substituted" group is the sum of the carbon atoms contained in the original (unsubstituted) group and the carbon atoms (if any) contained in the substituent. For example, for a $C_1$-$C_{20}$ alkyl group substituted with $C_6$-$C_{30}$ aryl group, the total number of carbon atoms in the resulting aryl substituted alkyl group is $C_7$-$C_{50}$.

Suitable polyarylenes for use in the sensing layer include the reaction product of monomers comprising a first monomer comprising an aromatic acetylene group and a second monomer comprising a cyclopentadienone group, and cured products thereof. The first and second monomers can be the same or different, and the first and second monomers can optionally and preferably each include acetylene and cyclopentadienone groups. Suitable polyarylene polymers include, for example, those comprising as polymerized units one or more first monomers chosen from formula (1) and formula (2):

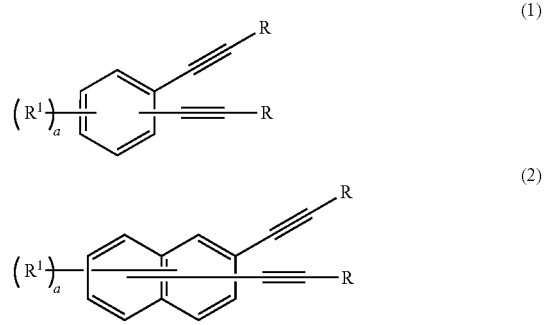

wherein: R is independently chosen from H, —C(=O)OR², substituted or unsubstituted $C_{6-20}$ aryl, or substituted or unsubstituted $C_{4-20}$ heteroaryl; $R^1$ is independently chosen from F, substituted or unsubstituted $C_{1-10}$ alkyl, such as $C_{1-10}$ fluoroalkyl, $C_{1-10}$ hydroxyalkyl, or $C_{1-10}$ aminoalkyl, substituted or unsubstituted $C_{6-20}$ aryl, $C_{4-20}$ heteroaryl, —C≡C—R, —C(=O)OR², —C(=O)NHR³, —O—C(=O)R⁴, —NHC(=O)R⁵, —S(=O)₂—OR⁶, or S(=O)₂—NHR³; $R^2$ is independently chosen from H, substituted or unsubstituted $C_{1-10}$ alkyl, such as $C_{1-10}$ fluoroalkyl, $C_{1-10}$ hydroxyalkyl, or $C_{1-10}$ aminoalkyl, $C_{6-20}$ aryl, or $C_{4-20}$ heteroaryl; $R^3$ is independently chosen from H or substituted or unsubstituted $C_{1-10}$ alkyl; $R^4$ is independently chosen from H or substituted or unsubstituted $C_{1-10}$ alkyl, such as $C_{1-10}$ hydroxyalkyl, —O($C_{1-10}$ alkyl), or —NH($C_{1-10}$ alkyl); $R^5$ is independently chosen from H or substituted or unsubstituted $C_{1-10}$ alkyl, such as $C_{1-10}$ hydroxyalkyl, —O($C_{1-10}$ alkyl), or —NH($C_{1-10}$ alkyl); $R^6$ is independently chosen from H or substituted or unsubstituted $C_{1-10}$ alkyl; and one or more second monomers comprising two cyclopentadienone moieties. The aryl groups may include one or more heteroatoms, for example, N, O, or S, with preferable heteroaryl groups including, for example, one or more of furan, pyridine, pyrazine, pyrazole, triazine, oxazole, indole, benzofuran, carbazole, thiophene, quinolone, isoquinoline, or chromene. Typical substituents for aryl groups include, for example, one or more of hydroxy, fluoro, amino, carboxy, thio, or thiocarbonyl.

Each R is preferably independently chosen from H, $C_{6-20}$ aryl, or $C_{4-20}$ heteroaryl, more preferably from H, $C_{6-10}$ aryl, or $C_{4-10}$ heteroaryl, and yet more preferably from H or phenyl. It is preferred that each $R^1$ is independently chosen from —C(=O)OR², —C(=O)NHR³, —O—C(=O)R⁴, —S(=O)₂—OR⁶, and S(=O)₂—NHR³ more preferably from —C(=O)OR² and —C(=O)NHR³, and yet more preferably —C(=O)OR². Preferably, $R^2$ is H, $C_{1-6}$ alkyl, $C_{1-6}$ hydroxyalkyl, or $C_{1-6}$ aminoalkyl, more preferably H, $C_{1-4}$ alkyl, or $C_{1-6}$ hydroxyalkyl, and even more preferably H. $R^3$ is preferably H or $C_{1-6}$ alkyl, and more preferably H or $C_{1-4}$ alkyl. It is preferred that $R^4$ is $C_{1-6}$ alkyl, $C_{1-6}$ hydroxyalkyl, —O($C_{1-10}$ alkyl), or —NH($C_{1-10}$ alkyl), and more preferably $C_{1-6}$ alkyl, $C_{1-6}$ hydroxyalkyl, —O($C_{1-6}$ alkyl), or —NH($C_{1-6}$ alkyl). $R^5$ is preferably H, $C_{1-10}$ alkyl, —O($C_{1-10}$ alkyl), or —NH($C_{1-10}$ alkyl), and more preferably H, $C_{1-6}$ alkyl, —O($C_{1-6}$ alkyl), or —NH($C_{1-6}$ alkyl). $R^6$ is preferably H or $C_{1-6}$ alkyl, more preferably H or $C_{1-4}$ alkyl, and even more preferably H. For monomers of formula (1), it is preferred that a=1 or 2, and more preferably a=1. For monomers of formula (2), a is preferably 1 to 3, more preferably 1 or 2, and even more preferably 1. Any 2 alkynyl moieties in the monomers of formulas (1) and (2) may have an ortho, meta or para relationship to each other, and preferably a meta or para relationship to each other. Preferably, the alkynyl moieties do not have an ortho relationship to each other. Suitable monomers of formulas (1) and (2) are generally commercially available or may be readily prepared by methods known in the art.

The polyarylene polymers may be comprised of one or monomers of formula (1), or one or more monomers of formula (2), or a mixture of one or more monomers of formula (1) and one or more monomers of formula (2). Monomers of formula (1) are preferred first monomers. It is preferred that the polyarylene polymers are comprised of one or more monomers of formula (1) or a mixture of one or more monomers of formula (1) and one or more monomers of formula (2), and more preferably the polyarylene polymers are comprised of one or more monomers of formula (1).

Any monomer containing two cyclopentadienone moieties may suitably be used as the second monomer to prepare the present polymers. Alternatively, a mixture of 2 or more different monomers, each having two cyclopentadienone moieties, may be used as the second monomer. Such monomers containing two cyclopentadienone moieties are well-known in the art, such as those described in: U.S. Pat. Nos. 5,965,679; 6,288.188; and 6,646,081; U.S. Application Publication No. 2017-0009006 A1; and Int. Pat. Pubs. WO 97/10193 and WO 2004/073824. It is preferred that the second monomer has the structure shown in formula (3):

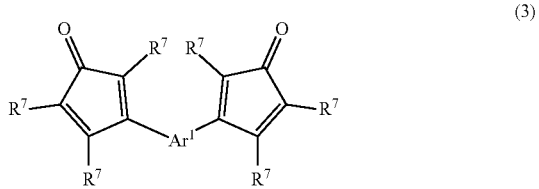

wherein each $R^7$ is independently chosen from H, substituted or unsubstituted $C_{1-6}$ alkyl, substituted or unsubstituted $C_{6-20}$ aryl, or substituted or unsubstituted $C_{4-20}$ heteroaryl; and $Ar^1$ is an aromatic moiety. Preferably, each $R^7$ is independently chosen from $C_{3-6}$ alkyl, phenyl, or substituted phenyl, and more preferably each $R^7$ is phenyl. A wide variety of aromatic moieties are suitable for use as $Ar^1$, such as those disclosed in U.S. Pat. No. 5,965,679. Exemplary aromatic moieties useful for $Ar^1$ include those having the structure shown in formula (4):

wherein x is an integer chosen from 1, 2 or 3; y is an integer chosen from 0, 1, or 2; each $Ar^2$ is independently chosen from:

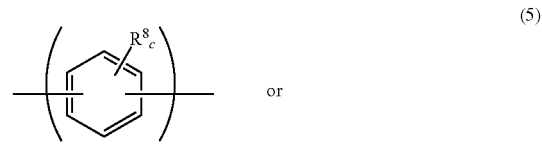

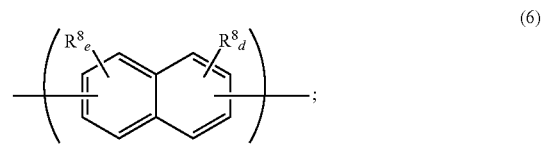

each $R^8$ is independently chosen from halogen, substituted or unsubstituted $C_{1-6}$ alkyl, such as $C_{1-6}$ haloalkyl, $C_{1-6}$ alkoxy, $C_{1-6}$ haloalkoxy, phenyl, and phenoxy; c is an integer from 0 to 4; each of d and e is an integer from 0 to 3; each Z is independently chosen from O, S, $NR^9$, $PR^9$, $P(=O)R^9$, $C(=O)$, $CR^{10}R^{11}$, and $SiR^{10}R^{11}$; $R^9$, $R^{10}$, and $R^{11}$ are independently chosen from H, substituted or unsubstituted $C_{1-4}$ alkyl, such as $C_{1-4}$ haloalkyl, and phenyl. It is preferred that x is 1 or 2, and more preferably 1. It is preferred that y is 0 or 1, and more preferably 1. Preferably, each $R^8$ is independently chosen from halogen, substituted or unsubstituted $C_{1-4}$ alkyl, such as halo $C_{1-4}$ alkyl, $C_{1-4}$ alkoxy, halo $C_{1-4}$ alkoxy, and phenyl, and more preferably from fluoro, $C_{1-4}$ alkyl, fluoro $C_{1-4}$ alkyl, $C_{1-4}$ alkoxy, fluoro $C_{1-4}$ alkoxy, and phenyl. It is preferred that c is from 0 to 3, more preferably from 0 to 2, and yet more preferably 0 or 1. It is preferred that each of d and e is independently 0 to 2, and more preferably 0 or 1. In formula (6), it is preferred that d+e=0 to 4, and more preferably 0 to 2. Each Z is preferably independently chosen from O, S, $NR^9$, $C(=O)$, $CR^{10}R^{11}$, and $SiR^{10}R^{11}$, more preferably from O, S, $C(=O)$, and $CR^{10}R^{11}$, and yet more preferably from O, $C(=O)$, and $CR^{10}R^{11}$. It is preferred that each $R^9$, $R^{10}$, and $R^{11}$ are independently chosen from H, $C_{1-4}$ alkyl, fluoro $C_{1-4}$ alkyl, and phenyl; and more preferably from H, $C_{1-4}$ alkyl, fluoro $C_{1-2}$ alkyl, and phenyl. Preferably, each $Ar^2$ has the formula (5).

Suitable exemplary polyarylenes include the following:

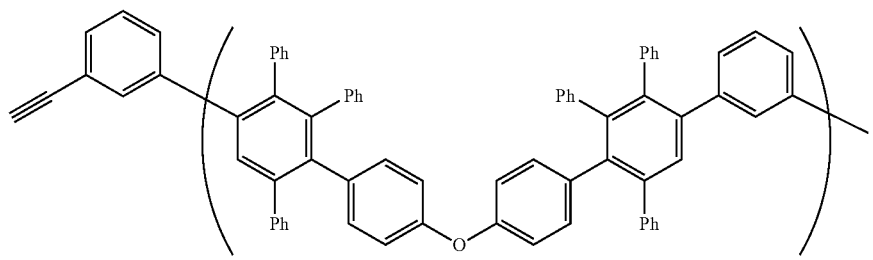

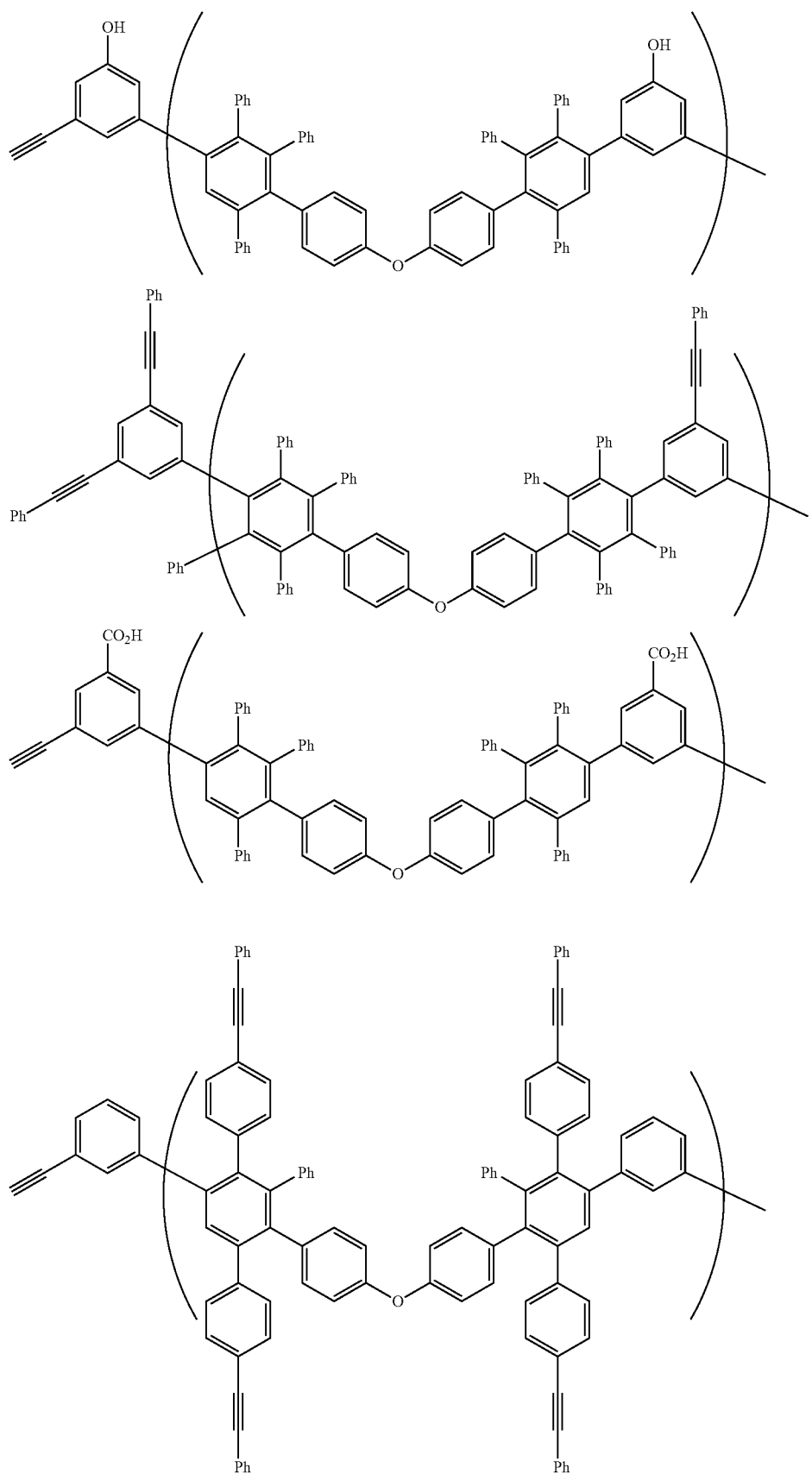

-continued

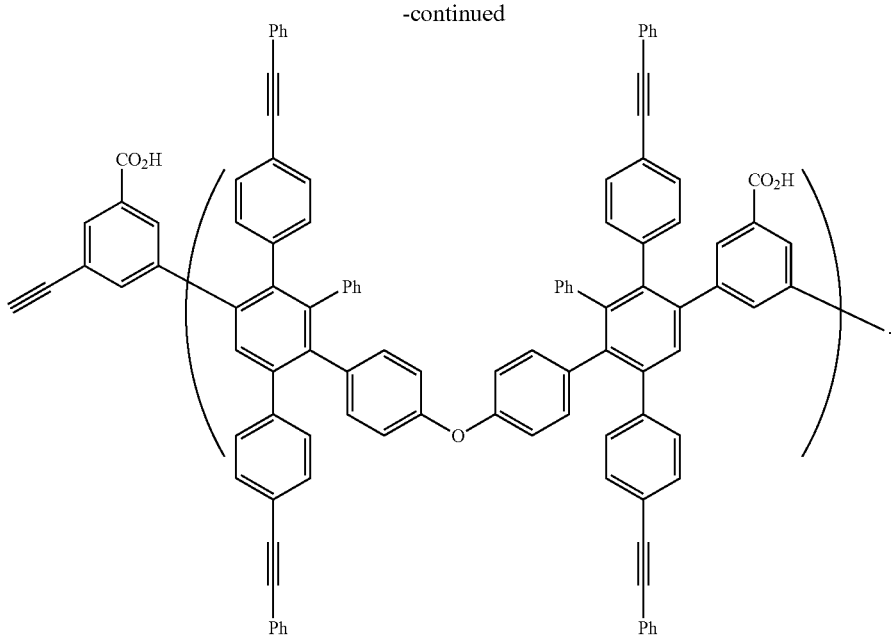

The number of repeat units in the polyarylene polymers is typically from 2 to 100. The polyarylene polymer can take the form of a homopolymer or a copolymer having two, three, or more different types of repeating units. Suitable polyarylene polymers can, for example, comprise one or more of the repeating units represented in the exemplary polyarylene structures. The polyarylene polymers typically have a number average molecular weight Mn of from 1 kDa to 200 kDa, for example, from 3 to 100 or from 4 to 50, determined by GPC using a Polystyrene standard.

Suitable polyamic acids for use in the sensing layer include, for example, those comprising one or more polymerized units of the following formula (7):

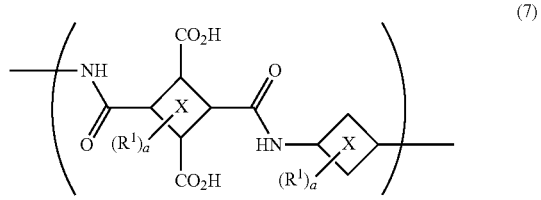
(7)

wherein X is chosen from substituted or unsubstituted $C_{4-20}$ cyclo-, bicyclo-, tricyclo- or tetracycloalkyl, substituted or unsubstituted $C_{4-20}$ aryl, or substituted or unsubstituted $C_{4-20}$ heteroaryl; each $R^1$ is independently chosen from —OH, —F, —Cl, —Br, —I, —$NO_2$, —CN, —C(=O)$OR^2$, —C(=O)$NHR^3$, —O—C(=O)$R^4$, —NHC(=O)$R^5$, —S(=O)$_2$—$OR^6$, or —S(=O)$_2$—$NHR^3$; $R^2$ is chosen from H or substituted or unsubstituted $C_{1-10}$ alkyl, such as $C_{1-10}$ fluoroalkyl, $C_{1-10}$ perfluoroalkyl, $C_{1-10}$ hydroxyalkyl, or $C_{1-10}$ aminoalkyl; $R^3$ is chosen from H or $C_{1-10}$ substituted or unsubstituted alkyl; $R^4$ is chosen from H or substituted or unsubstituted $C_{1-10}$ alkyl, such as $C_{1-10}$ hydroxyalkyl, —O($C_{1-10}$ alkyl), or —NH($C_{1-10}$ alkyl); $R^5$ is chosen from H or substituted or unsubstituted $C_{1-10}$ alkyl, such as $C_{1-10}$ hydroxyalkyl, —O($C_{1-10}$ alkyl), or —NH($C_{1-10}$ alkyl); $R^6$ is chosen from H or substituted or unsubstituted $C_{1-10}$ alkyl; and each a is independently an integer from 0 to the total number of available carbon hydrogens on X.

Suitable exemplary polyamic acid units include the following:

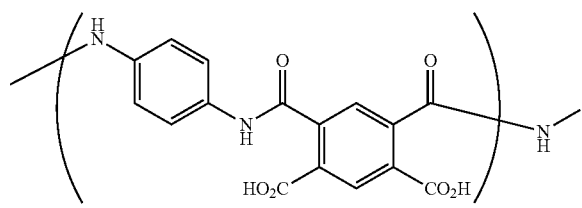

-continued
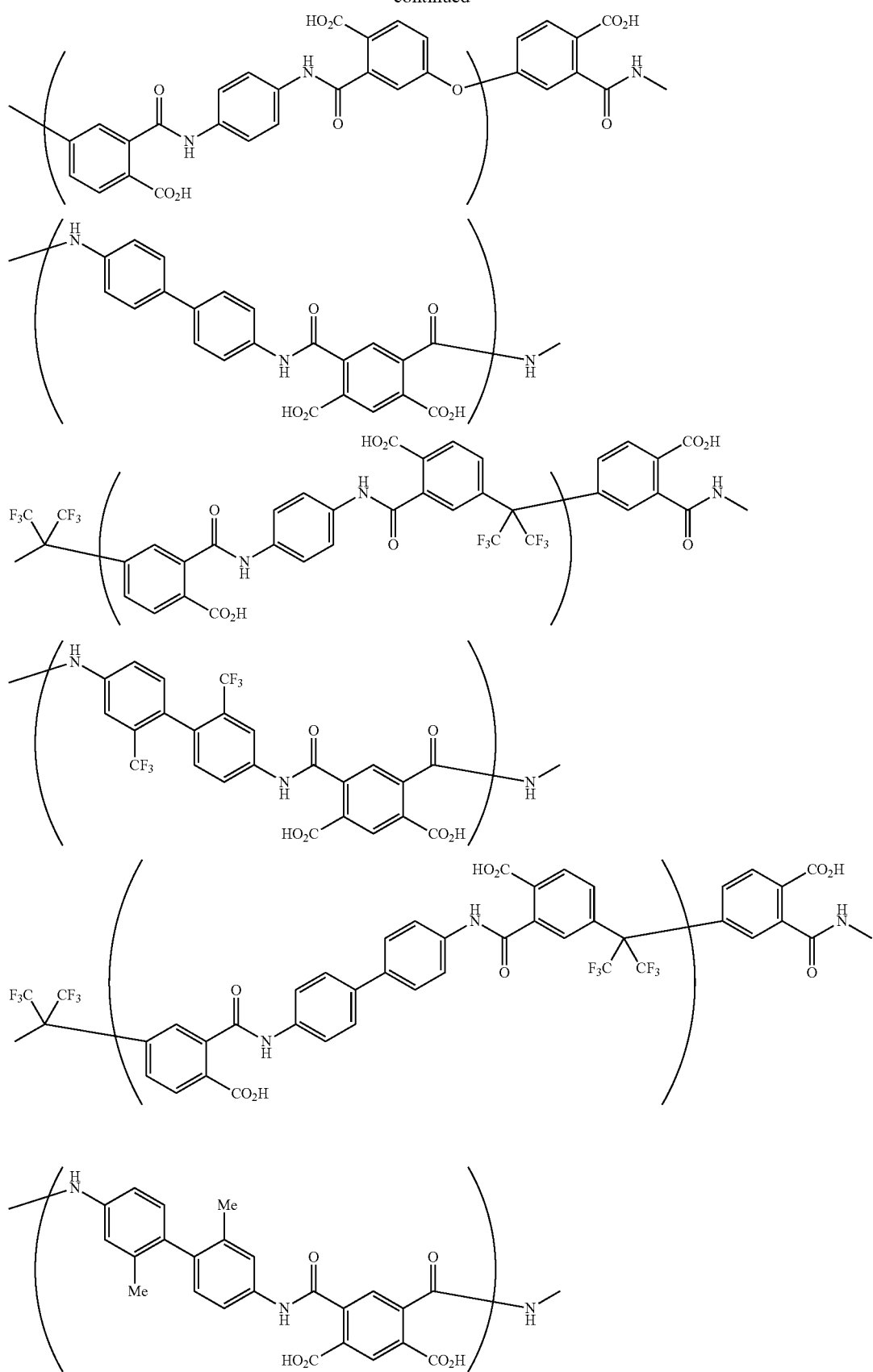

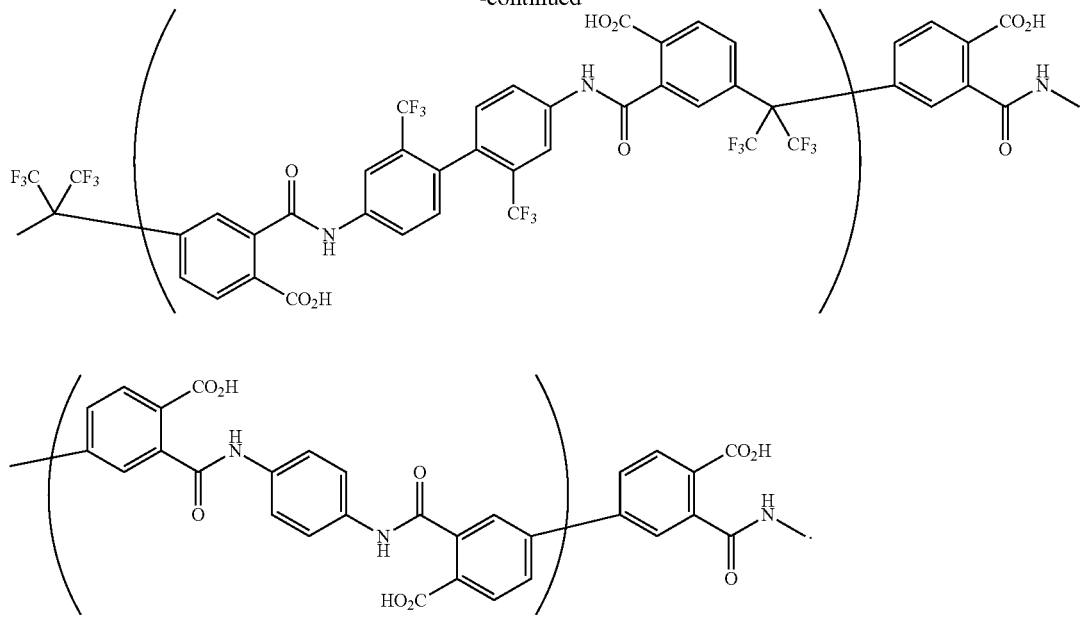

The polyamic acids can take the form of a homopolymer of polymerized units of formula (7), or can be a copolymer formed from two or more different units of formula (7). Suitable polymers containing polyamic acid units as described above, can further contain one or more such units that have been fully imidized. Such polymers can include, for example, those of formula (8):

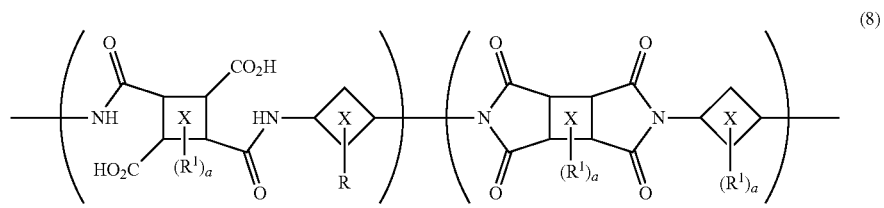

(8)

wherein X, $R^1$ and a are each independently selected and are as defined above with respect to formula (7). A copolymer containing polymerized units of formula (7) or (8) can typically contain up to 99 mole %, for example, from 10 to 90 mole % or from 30 to 70 mole % of the fully imidized monomer units, based on total repeat units of the sensing polymer.

Suitable exemplary poly(amic acid)-polyimide copolymers include the following:

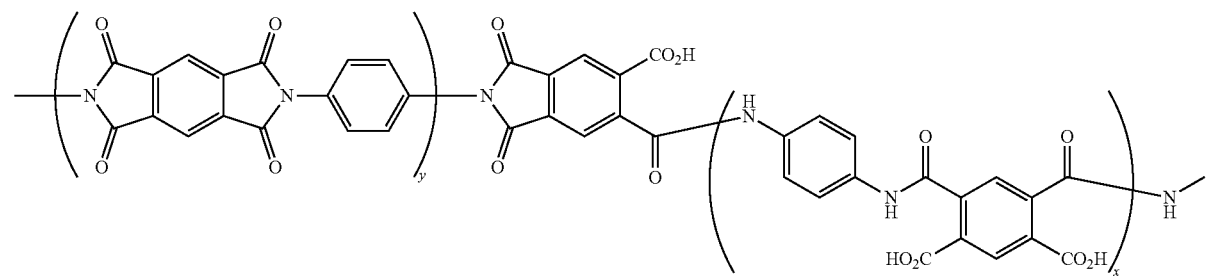

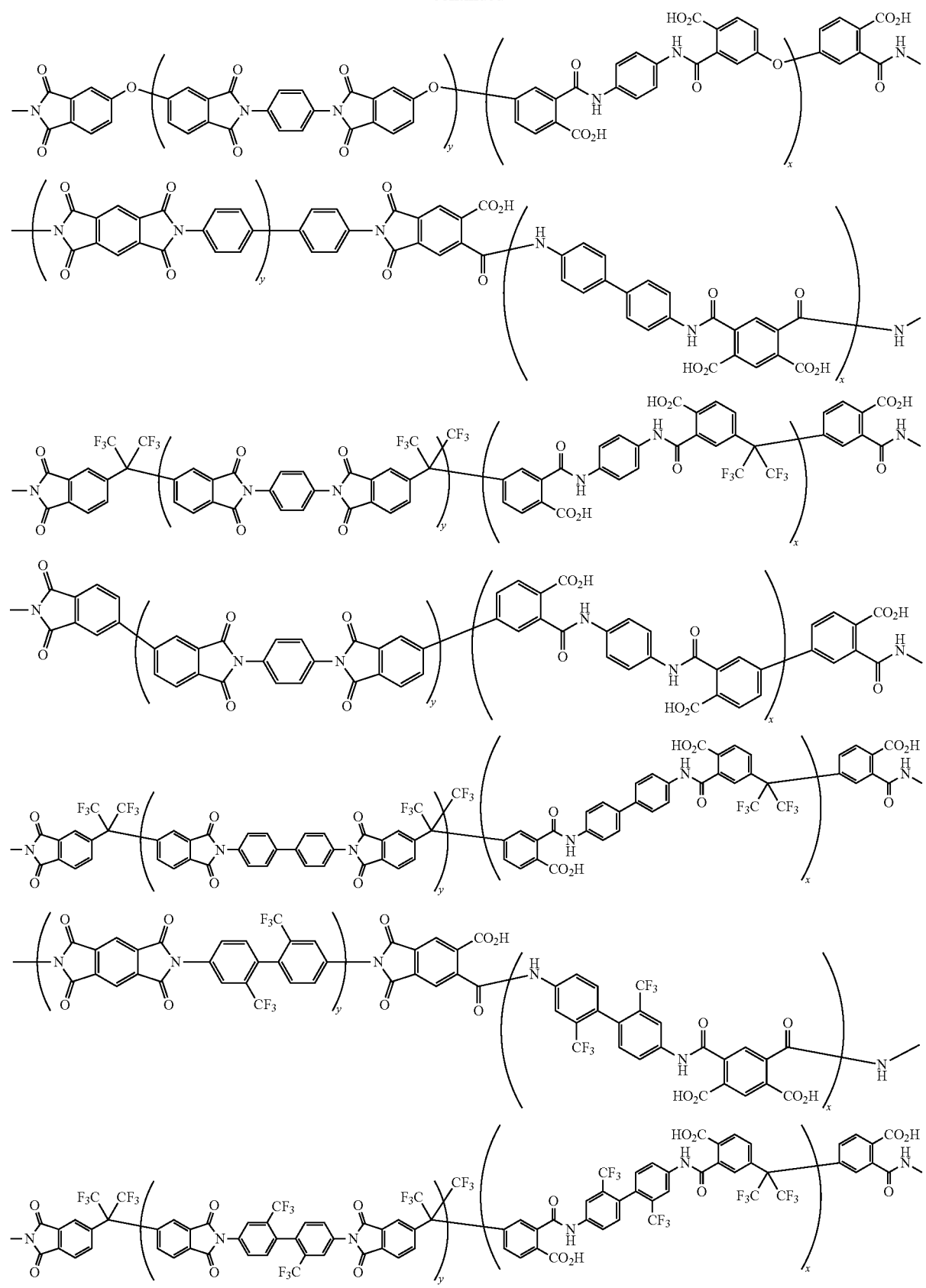

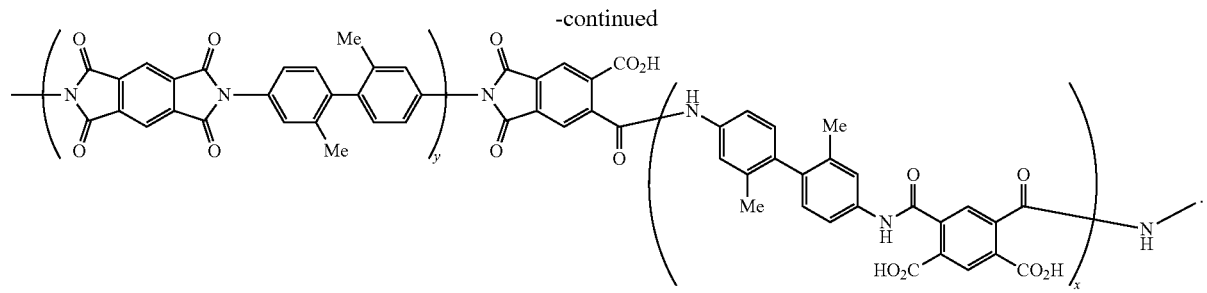

wherein x is from 0 to 99 mole % and y is from 0 to 100 mole %, based on total repeat units of the sensing polymer. The polyamic acids and polyimide-poly(amic acid) copolymers typically have a number average molecular weight Mn of from 1 to 100 kDa, for example, from 2 to 25 kDa, as determined by GPC using a Polystyrene standard.

Suitable polyamides for use in the sensing layer include, for example, those of formula (9) or formula (10):

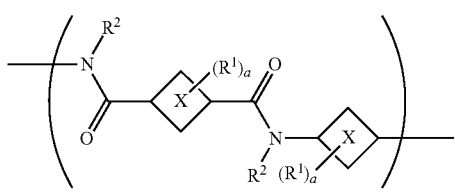 (9)

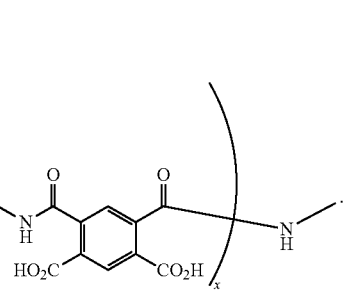 (10)

wherein X is chosen from substituted or unsubstituted $C_{4-20}$ cyclo-, bicyclo-, tricyclo- or tetracycloalkyl, substituted or unsubstituted $C_{6-20}$ aryl, or substituted or unsubstituted $C_{4-20}$ heteroaryl; each R is independently chosen from —F, —Cl, —Br, —I, —NO$_2$ example, —CN, —C(=O)NHR$^3$, —S(=O)$_2$—OR$^4$, or —S(=O)$_2$—NHR$^3$; each $R^3$ and $R^4$ is independently chosen from H or substituted or unsubstituted $C_{1-2}$ alkyl; and $R^3$ and $R^4$ are each independently chosen from H or substituted or unsubstituted $C_{1-10}$ alkyl. Polyamides of formula (9) can be prepared by polymerization of dicarboxylates and diamines, and those of formula (10) can be prepared by polymerization of an aminocarboxylate, for example, amides (cyclic amides, e.g., cyclic lactams), amino acids or other A-B amino carboxylates.

Suitable exemplary polyamides include the following:

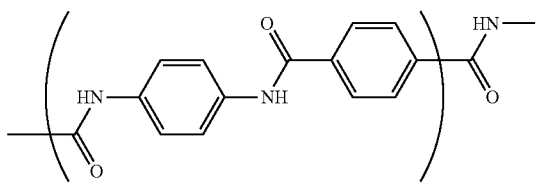 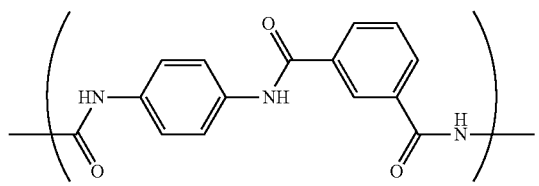

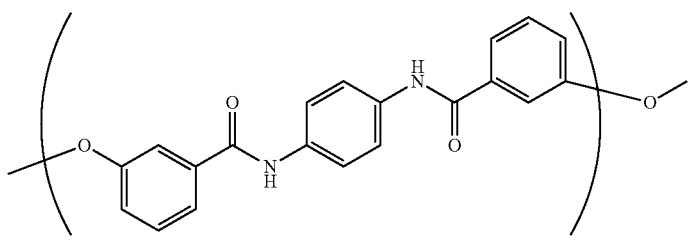

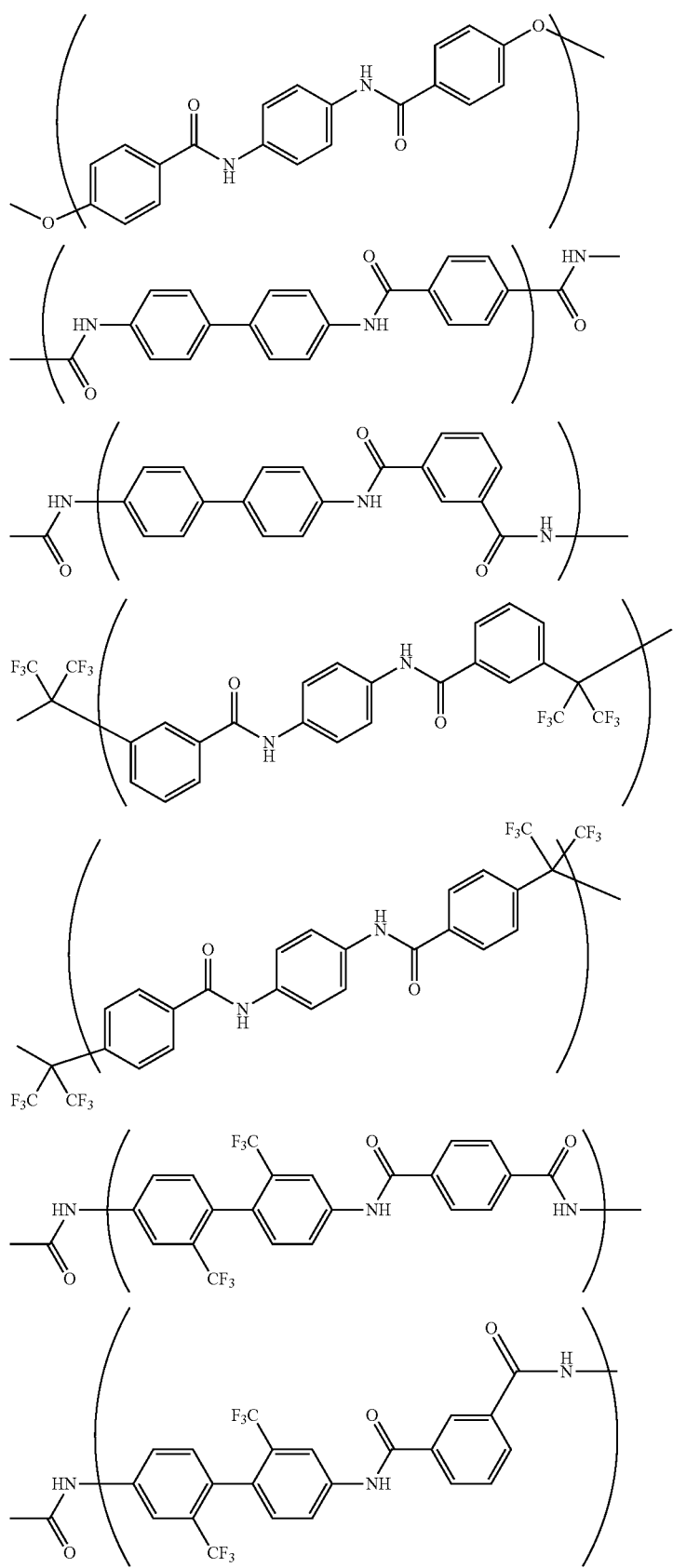

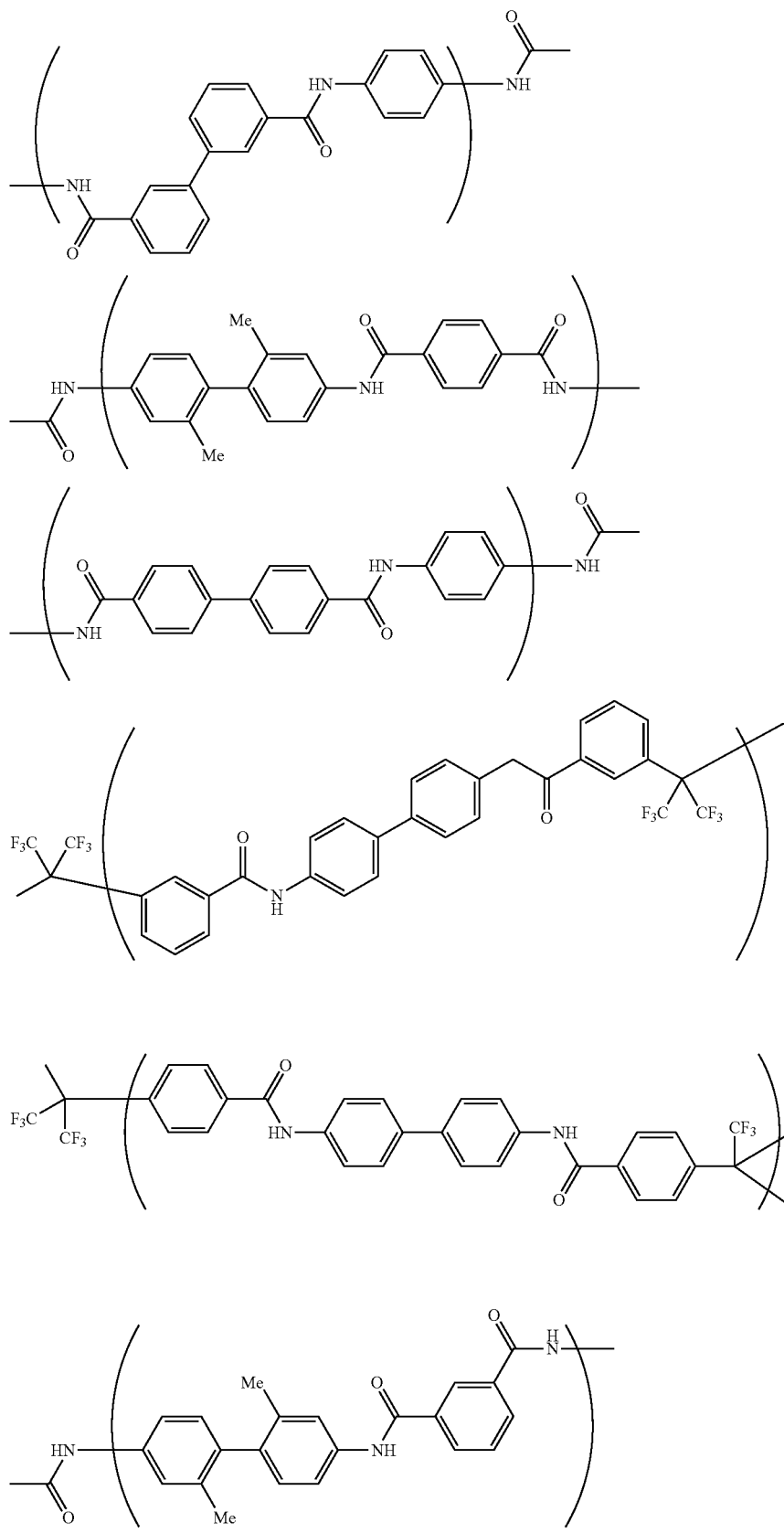

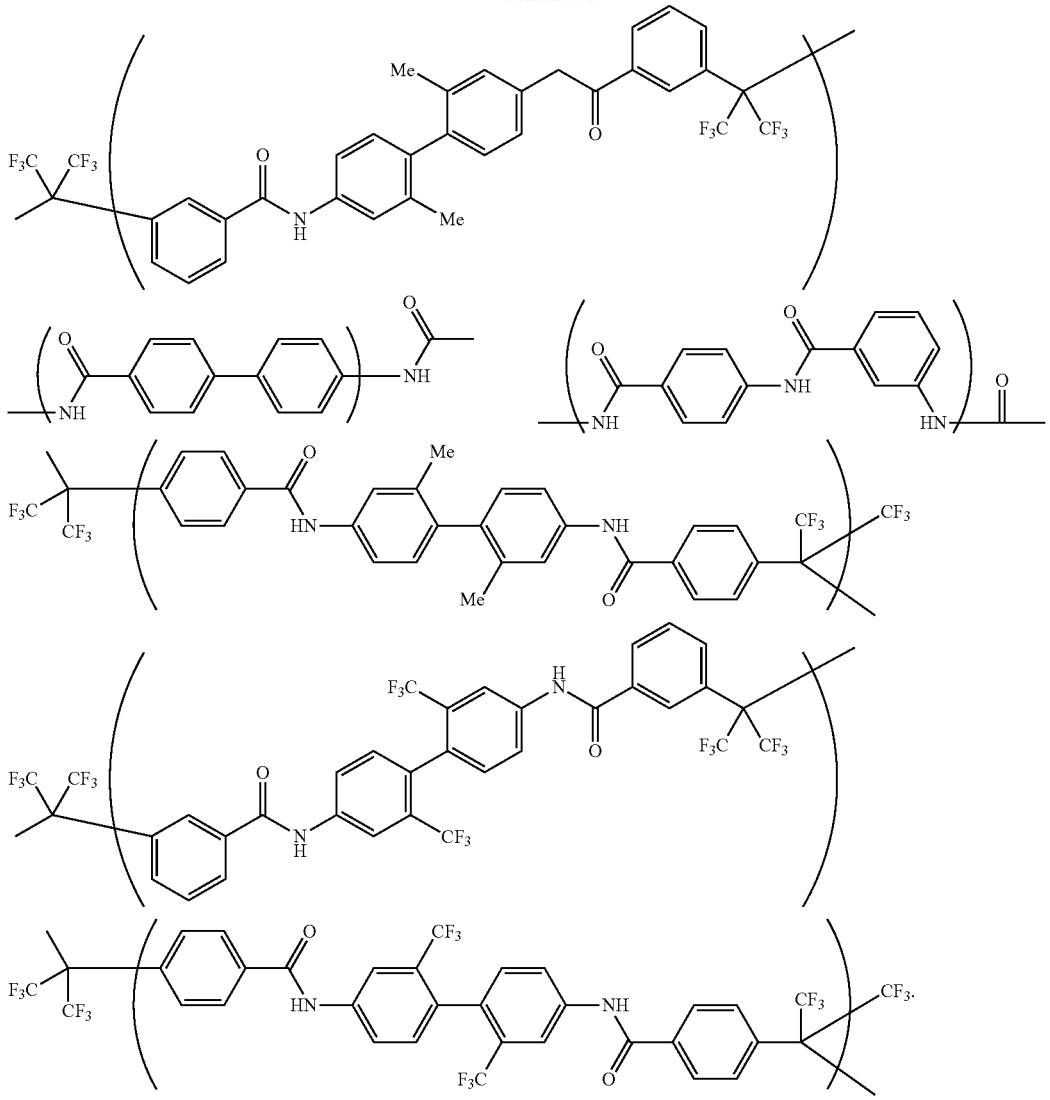

The polyamides can take the form of a homopolymer of polymerized units of formula (9) or (10), or can be a copolymer formed from two or more different units of formula (9) and/or (10). The polyamides typically have a number average molecular weight Mn of from 1 kDa to 100 kDa, for example, from 2 kDa to 25 kDa or 5 kDa to 15 kDa, based on Polystyrene standard.

Suitable polypyrazoles for use in the sensing layer include, for example, the reaction product of a first monomer having an aromatic acetylene group and a second monomer comprising two or more sydnone groups. Preferably, the polypyrazoles are the reaction product of a monomer of formula (1) and/or (2), with a monomer of formula (11):

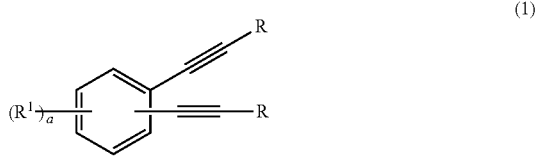
(1)

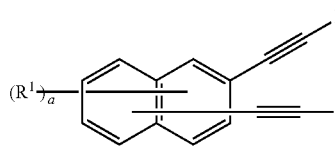

wherein: R is independently chosen from H, —C(=O)OR$^2$, substituted or unsubstituted C$_{6-20}$ aryl, or substituted or unsubstituted C$_{4-20}$ heteroaryl: R$^1$ is independently chosen from F, substituted or unsubstituted C$_{1-10}$ alkyl, such as C$_{1-10}$ fluoroalkyl, C$_{1-10}$ hydroxyalkyl, or C$_{1-10}$ aminoalkyl, substituted or unsubstituted C$_{6-20}$ aryl, C$_{4-20}$ heteroaryl, —C≡C—R, —C(=O)OR$^2$, —C(=O)NHR$^3$, —O—C(=O)R$^4$, —NHC(=O)R$^5$, —S(=O)$_2$—OR$^6$, or S(=O)$_2$—NHR$^3$; R$^2$ is independently chosen from H, substituted or unsubstituted C$_{1-10}$ alkyl, such as C$_{1-10}$ fluoroalkyl, C$_{1-10}$ hydroxyalkyl, or C$_{1-10}$ aminoalkyl, C$_{6-20}$ aryl, or C$_{4-20}$ heteroaryl; R$^3$ is independently chosen from H or substituted or unsubstituted C$_{1-10}$ alkyl; R$^4$ is independently chosen from H or substituted or unsubstituted C$_{1-10}$ alkyl, such as $C_{1-10}$ hydroxyalkyl, —O($C_{1-10}$ alkyl), or —NH($C_{1-10}$ alkyl); $R^5$ is independently chosen from H or substituted or unsubstituted $C_{1-10}$ alkyl, such as $C_{1-10}$ hydroxyalkyl, —O($C_{1-10}$ alkyl), or —NH($C_{1-10}$ alkyl); $R^6$ is independently chosen from H or substituted or unsubstituted $C_{1-10}$ alkyl; and one or more second monomers comprising two cyclopentadienone moieties. The aryl groups may include one or more heteroatoms, for example, N, O, or S, with preferable heteroaryl groups including, for example, one or more of furan, pyridine, pyrazine, pyrazole, triazine, oxazole, indole, benzofuran, carbazole, thiophene, quinolone, isoquinoline, or chromene. Typical substituents for aryl groups include, for example, one or more of hydroxy, fluoro, amino, carboxy, thio, or thiocarbonyl.

Each R is preferably independently chosen from H, $C_{6-20}$ aryl, or $C_{4-20}$ heteroaryl, more preferably from H, $C_{6-10}$ aryl, or $C_{4-10}$ heteroaryl, and yet more preferably from H or phenyl. It is preferred that each $R^1$ is independently chosen from —C(=O)O$R^2$, —C(=O)NH$R^3$, —O—C(=O)$R^4$, —S(=O)$_2$—O$R^6$, and S(=O)$_2$—NH$R^3$ more preferably from —C(=O)O$R^2$ and —C(=O)NH$R^3$, and yet more preferably —C(=O)O$R^2$. Preferably, $R^2$ is H, $C_{1-6}$ alkyl, $C_{1-6}$ hydroxyalkyl, or $C_{1-6}$ aminoalkyl, more preferably H, $C_{1-4}$ alkyl, or $C_{1-6}$ hydroxyalkyl, and even more preferably H. $R^3$ is preferably H or $C_{1-6}$ alkyl, and more preferably H or $C_{1-4}$ alkyl. It is preferred that $R^4$ is $C_{1-6}$ alkyl, $C_{1-6}$ hydroxyalkyl, —O($C_{1-10}$ alkyl), or —NH($C_{1-10}$ alkyl), and more preferably $C_{1-6}$ alkyl, $C_{1-6}$ hydroxyalkyl, —O($C_{1-6}$ alkyl), or —NH($C_{1-6}$ alkyl). $R^5$ is preferably H, $C_{1-10}$ alkyl, —O($C_{1-10}$ alkyl), or —NH($C_{1-10}$ alkyl), and more preferably H, $C_{1-6}$ alkyl, —O($C_{1-6}$ alkyl), or —NH($C_{1-6}$ alkyl). $R^6$ is preferably H or $C_{1-6}$ alkyl, more preferably H or $C_{1-4}$ alkyl, and even more preferably H. For monomers of formula (1), it is preferred that a=1 or 2, and more preferably a=1. For monomers of formula (2), a is preferably 1 to 3, more preferably 1 or 2, and even more preferably 1. Any 2 alkynyl moieties in the monomers of formulas (1) and (2) may have an ortho, meta or para relationship to each other, and preferably a meta or para relationship to each other. Preferably, the alkynyl moieties do not have an ortho relationship to each other. Suitable monomers of formulas (1) and (2) are generally commercially available or may be readily prepared by methods known in the art.

Any monomer containing two sydnone moieties may suitably be used as the second monomer to prepare the present polymers. Alternatively, a mixture of two or more different monomers, each having two sydnone moieties, may be used as the second monomer. Such monomers containing two sydnone moieties are well-known in the art, such as those described in J. Am. Chem. Soc. 2016, 138, 6400-6403, U.S. Pat. No. 4,607,093 and Japanese Application Pub. No. JP2017025310A. It is preferred that the second monomer has the structure shown in formula (11):

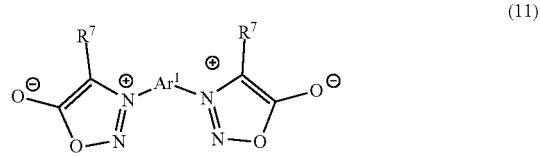

(11)

wherein each $R^7$ is independently chosen from H, substituted or unsubstituted $C_{1-6}$ alkyl, substituted or unsubstituted $C_{6-30}$ aryl, or substituted or unsubstituted $C_{4-30}$ heteroaryl; and $Ar^1$ is an aromatic moiety. A wide variety of aromatic moieties are suitable for use as $Ar^1$, such as those disclosed in U.S. Pat. No. 5,965,679. Exemplary aromatic moieties useful for $Ar^1$ include those having the structure shown in formula (4):

(4)

wherein x is an integer chosen from 1, 2 or 3; y is an integer chosen from 0, 1, or 2; each $Ar^2$ is independently chosen from:

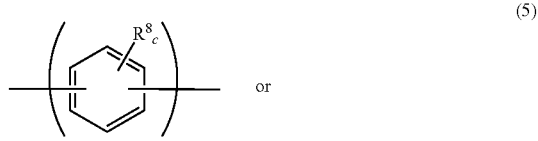

(5)

or

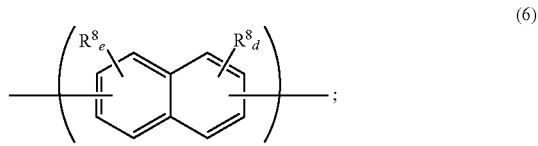

(6)

each $R^8$ is independently chosen from halogen, substituted or unsubstituted $C_{1-6}$ alkyl, such as $C_{1-6}$ haloalkyl, $C_{1-6}$ alkoxy, $C_{1-6}$ haloalkoxy, phenyl, and phenoxy; c is an integer from 0 to 4; each of d and e is an integer from 0 to 3; each Z is independently chosen from O, S, N$R^9$, P$R^9$, P(=O)$R^9$, C(=O), C$R^{10}R^{11}$, and Si$R^{10}R^{11}$; $R^9$, $R^{10}$, and $R^{11}$ are independently chosen from H, substituted or unsubstituted $C_{1-4}$ alkyl, such as $C_{1-4}$ haloalkyl, and phenyl. It is preferred that x is 1 or 2, and more preferably 1. It is preferred that y is 0 or 1, and more preferably 1. Preferably, each $R^8$ is independently chosen from halogen, substituted or unsubstituted $C_{1-4}$ alkyl, such as halo $C_{1-4}$ alkyl, $C_{1-4}$ alkoxy, halo $C_{1-4}$ alkoxy, and phenyl, and more preferably from fluoro, $C_{1-4}$ alkyl, fluoro $C_{1-4}$ alkyl, $C_{1-4}$ alkoxy, fluoro $C_{1-4}$ alkoxy, and phenyl. It is preferred that c is from 0 to 3, more preferably from 0 to 2, and yet more preferably 0 or 1. It is preferred that each of d and e is independently 0 to 2, and more preferably 0 or 1. In formula (6), it is preferred that d+e=0 to 4, and more preferably 0 to 2. Each Z is preferably independently chosen from O, S, N$R^9$, C(=O), C$R^{10}R^{11}$, and Si$R^{10}R^{11}$, more preferably from O, S, C(=O), and C$R^{10}R^{11}$, and yet more preferably from O, C(=O), and C$R^{10}R^{11}$. It is preferred that each $R^9$, $R^{10}$, and $R^{11}$ are independently chosen from H, $C_{1-4}$ alkyl, fluoro $C_{1-4}$ alkyl, and phenyl; and more preferably from H, $C_{1-4}$ alkyl, fluoro $C_{1-2}$ alkyl, and phenyl. Preferably, each $Ar^2$ has the formula (5).

Suitable exemplary polypyrazoles include the following:

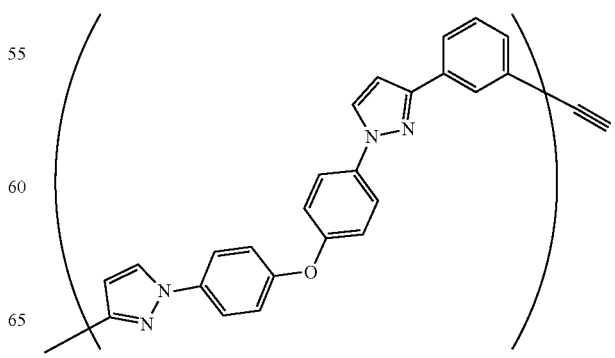

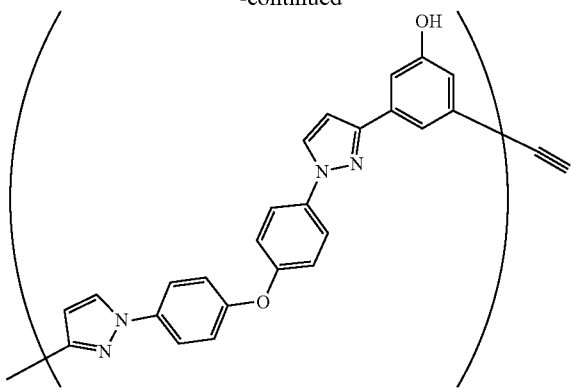

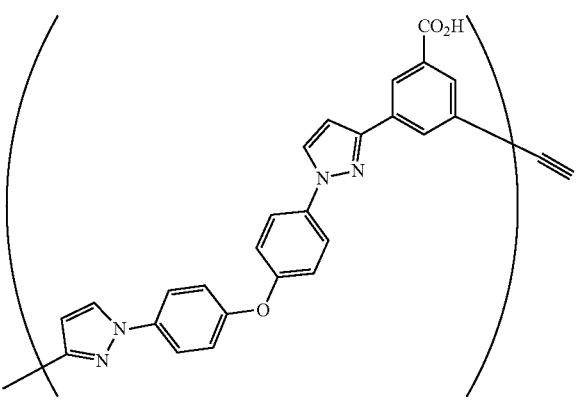

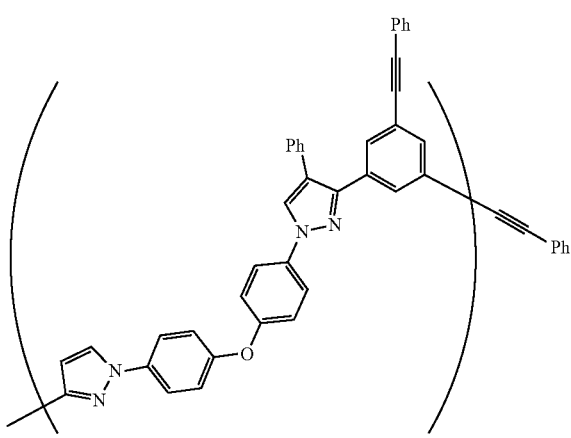

The number of repeat units in the polypyrazole polymers is typically from 2 to 100. The polypyrazole polymers can take the form of a homopolymer or a copolymer having two, three, or more different types of repeating units. The polypyrazole polymers typically have a number average molecular weight Mn of from 1 to 100 kDa, for example, from 2 to 50 kDa or from 1 to 20 kDa, as measured by GPC using a Polystyrene standard.

Suitable novolacs for use in the sensing layer include, for example, those of the following formula (12):

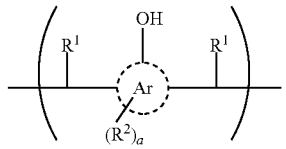

(12)

wherein: Ar is chosen from substituted or unsubstituted $C_{6-20}$ aryl or substituted or unsubstituted $C_{4-20}$ heteroaryl, wherein the aryl or heteroaryl group is monocyclic or polycyclic, for example, fused polycyclic; each $R^1$ is independently chosen from —H, —OH, substituted or unsubstituted $C_{3-20}$ alkyl, substituted or unsubstituted $C_{4-20}$ cyclo-, bicyclo-, tricyclo- or tetracycloalkyl, substituted or unsubstituted $C_{6-20}$ aryl, or substituted or unsubstituted $C_{4-20}$ heteroaryl; each $R^2$ is independently chosen from —H, —F, —Cl, —Br, —I, —NO$_2$, —CN, —C(=O)NHR$^3$, —S(=O)$_2$ —OR$^4$, S(=O)$_2$—NHR$^3$, or substituted or unsubstituted $C_{1-10}$ alkyl, such as $C_{1-10}$ fluoroalkyl, $C_{1-10}$ perfluoroalkyl, $C_{1-10}$ hydroxyalkyl, or $C_{1-10}$ aminoalkyl; $R^3$ is chosen from H or substituted or unsubstituted $C_{1-10}$ alkyl; and $R^4$ is chosen from H or substituted or unsubstituted $C_{1-10}$ alkyl; and a is an integer of from 0 to 3. Suitable exemplary novolac polymers comprise the following repeating units, which are the condensation reaction product of a phenolic monomer and a carbonyl-containing monomer:

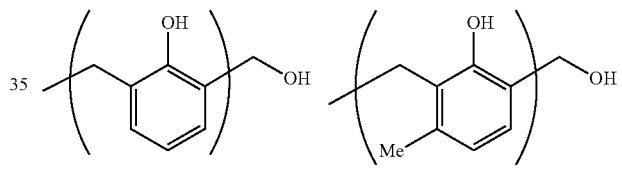

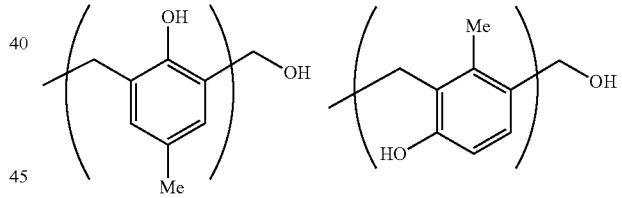

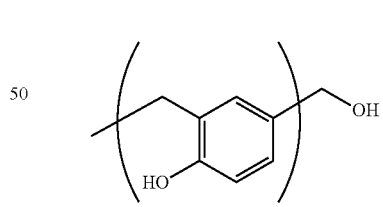

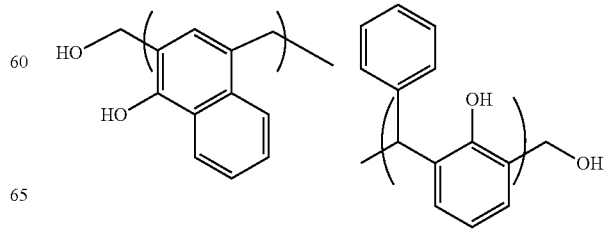

-continued

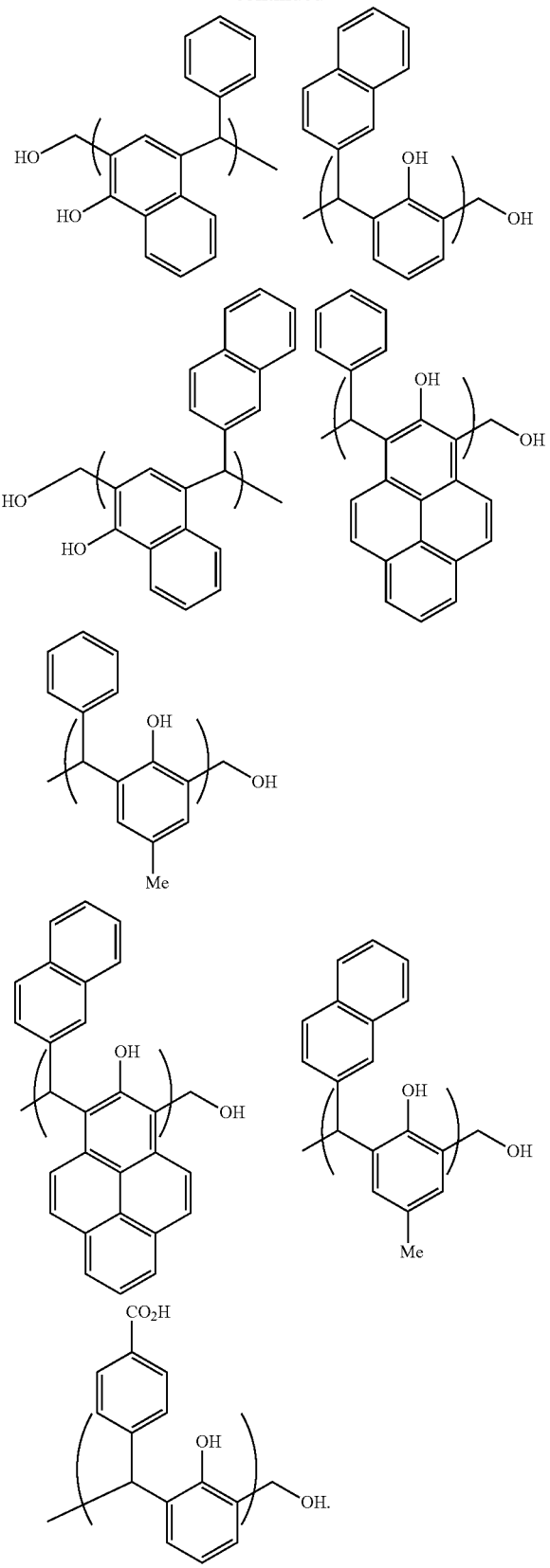

Suitable novolac polymers typically have a number average molecular weight Mn of from 0.5 to 25 kDa, for example, from 1 to 10 kDa or 2 to 5 kDa as measured by GPC using a Polystyrene standard.

Sensing polymers formed from a monomer comprising an arylcyclobutene group are substituted with a polar functional group. Suitable polar functional groups include, for example, one or more groups chosen from alcohol, carbonyl, carboxylic acid, ester, aldehyde, ketone, amide, nitrile, amine, ether, sulfhydryl, imide, and alkyl halide. Inclusion of a polar functional group in the sensing polymer can be beneficial, for example, where it has an affinity to an analyte, for example, analytes having a polar functionality and/or a polarizable functionality. Particularly preferred are polar functional groups that have an affinity for the analyte but do not form a covalent bond with the analyte at the desired operating temperature of the sensor, for example, from 20 to 25° C. or at higher temperature, for example, up to 100° C. A moderate affinity for the analyte without forming a covalent bond is particularly preferred for allowing reversible sorption of the analyte. Polymerized units containing polar group-substituted arylcyclobutene groups are typically present in the sensing polymers in an amount of from 1 to 100 mole %, more typically from 1 to 50 mole %, based total polymerized units of the sensing polymer.

Suitable such monomers include, for example, those of the formula (13):

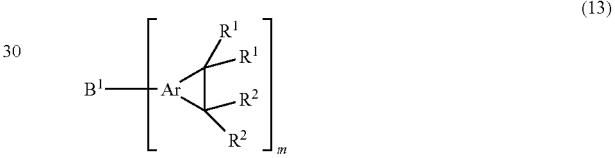

(13)

wherein: $B^1$ is a linking group, preferably containing one or more siloxane groups, ethylenically unsaturated groups, or a combination thereof; Ar is a polyvalent aryl group and the carbon atoms of the cyclobutene ring are bonded to adjacent carbon atoms on the same aromatic ring of Ar; m is an integer of 1 or more, typically from 1 to 4 or from 1 to 2; each of $R^1$ and $R^2$ is independently hydrogen or a monovalent hydrocarbon containing group, with hydrogen being preferred; the two $R^1$ moieties may be taken together along with the carbon to which they are attached to form a carbonyl or thiocarbonyl group; and the two $R^2$ moieties may be taken together along with the carbon to which they are attached to form a carbonyl or thiocarbonyl group.

Preferably, Ar includes from 1 to 3, preferably 1, aromatic carbocyclic or heteroaromatic rings, with a phenyl ring being typical. The aryl group can be substituted or unsubstituted. Optional substituents include, for example, $C_{1-6}$ alkyl, tri-$C_{1-6}$-alkylsilyl, $C_{1-6}$ alkoxy, halo, and carboxyl, preferably with one or more of $C_{1-6}$ alkyl, tri-$C_{1-3}$-alkylsilyl, $C_{1-3}$ alkoxy, chloro, bromo, fluoro, and carboxyl, and, more preferably, with one or more of $C_{1-3}$ alkyl, tri-$C_{1-3}$-alkylsilyl, $C_{1-3}$ alkoxy, and carboxyl.

Suitable $B^1$ groups include, for example, those having the formula —[C($R^3$)$_2$—C($R^4$)$_2$]Z or —[C($R^3$)—C$R^4$]$_x$Z, wherein each $R^3$ and $R^4$ are independently chosen from hydrogen, substituted or unsubstituted $C_{1-6}$ alkyl, substituted or unsubstituted $C_{6-20}$ aryl or substituted or unsubstituted $C_{4-20}$ heteroaryl; Z is chosen from hydrogen, substituted or unsubstituted $C_{1-6}$ alkyl, substituted or unsubstituted $C_{6-10}$ aryl, substituted or unsubstituted $C_{4-10}$ heteroaryl, substituted or unsubstituted siloxaryl, substituted or unsubstituted siloxyalkyl, or —CO$_2$$R^5$; each $R^5$ is independently chosen from H, substituted or unsubstituted $C_{1-6}$ alkyl, such as $C_{1-6}$ hydroxyalkyl, substituted or unsubstituted $C_{1-10}$ aryl, such as $C_{6-10}$ hydroxyaryl, $C_{4-10}$ heteroaryl, $C_{7-20}$ aralkyl, $C_{7-20}$ hydroxyaralkyl, or $C_{7-20}$ alkaryl; and x is 1 or 2. Preferably, $R^3$ and $R^4$ are independently chosen from H, $C_{1-3}$ alkyl, $C_{6-20}$ aryl or $C_{1-20}$ heteroaryl, and more preferably H or $C_{1-3}$ alkyl. It is preferred that $R^5$ is H, $C_{1-3}$ alkyl, $C_{1-6}$ hydroxyalkyl, $C_{1-10}$ aryl, $C_{4-10}$ heteroaryl, $C_{6-10}$ hydroxyaryl, or $C_{7-20}$ hydroxyaralkyl. Z is preferably siloxyl or $-CO_2R^5$. Preferred siloxyl groups have the formula $-[Si(R^6)_2-O]_p-Si(R^6)_2-$, wherein each $R^6$ is independently chosen from H, $C_{1-6}$ alkyl, $C_{6-20}$ aryl, $C_{4-20}$ heteroaryl, aralkyl, or alkaryl; and p is an integer of 1 or more. It is preferred that $R^6$ is chosen from $C_{1-3}$ alkyl, $C_{6-10}$ aryl, $C_{4-10}$ heteroaryl, and $C_{7-20}$ aralkyl. Suitable aralkyl groups include, for example, benzyl, phenethyl and phenylpropyl. Preferably, $B^1$ comprises two carbon-carbon double bonds (ethylenic unsaturation); more preferably, $B^1$ comprises two carbon-carbon double bonds and a siloxyl group.

The arylcyclobutene polymer contains at least one polymerized unit type of formula (13) in which the arylcyclobutene group is substituted with a polar group. The substitution can be on one or more of $B^1$, $R^1$, $R^2$ or Ar. Suitable polar functional groups include one or more groups chosen, for example, from alcohol, carbonyl, carboxylic acid, ester, aldehyde, ketone, amide, nitrile, amine, ether, sulfhydryl, imide, and alkyl halide. The polymer may contain additional units of formula (13) not substituted with a polar functional group.

Preferably, the arylcyclobutene polymers of the present invention comprise as polymerized units one or more bis-arylcyclobutene monomers of formula (14):

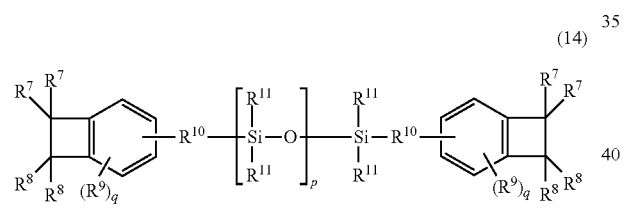

(14)

wherein each $R^7$ and $R^8$ is independently chosen from H, substituted or unsubstituted $C_{1-6}$ alkyl, substituted or unsubstituted $C_{1-6}$ alkenyl, substituted or unsubstituted $C_{1-6}$ alkoxy, halo, carboxy, $C_{2-6}$ carboxy-containing moiety, $C_{2-6}$ keto-containing moiety, $C_{1-6}$ amido-containing moiety, $C_{2-6}$ alkoxyalkanol, $C_{2-6}$ alkoxyester, $-O-C_{1-20}$ alkyl, $-(C=O)-C_{1-20}$ alkyl, $-O-(C=O)-C_{1-20}$ alkyl, $-(C=O)-O-C_{1-20}$ alkyl, $-O-C_{1-20}$ aryl, $-(C=O)-C_{1-20}$ aryl, $-O-(C=O)-C_{1-20}$ aryl, and $-(C=O)-O-C_{6-20}$ aryl, and preferably from H, $C_{1-3}$ alkyl, $C_{1-3}$ alkoxy and halo; wherein the two $R^7$ moieties may be taken together along with the carbon to which they are attached to form a carbonyl or thiocarbonyl; and wherein the two $R^8$ moieties may be taken together along with the carbon to which they are attached to form a carbonyl or thiocarbonyl; each $R^9$ is independently chosen from $C_{1-6}$ alkyl, tri-$C_{1-6}$-alkylsilyl, $C_{1-6}$ alkoxy, and halo; each $R^{10}$ is independently a divalent organic group which may be saturated, such as $C_{2-6}$ alkyl, $-CH_2CH_2-$, or ethylenically unsaturated group; each $R^{11}$ is independently chosen from H, $C_{1-6}$ alkyl, $C_{7-20}$ aralkyl and phenyl; p is an integer from 1 or more; and q is an integer from 0 to 3. Each $R^7$ and $R^{11}$ is preferably independently chosen from H, $C_{1-3}$ alkyl, and $C_{1-3}$ alkoxy, and more preferably each $R^7$ and $R^8$ is H. It is preferred that each $R^9$ is independently chosen from $C_{1-6}$ alkyl, tri-$C_{1-3}$-alkylsilyl, $C_{1-3}$ alkoxy, and chloro, and more preferably from $C_{1-3}$ alkyl, tri-$C_{1-3}$-alkylsilyl, and $C_{1-3}$ alkoxy. Preferably, each $R^{10}$ is independently chosen from, $C_{2-6}$ alkenyl, and $C_{2-6}$ alkynyl, and more preferably each $R^{10}$ is independently chosen from, $-CH=CH-$, and $-C\equiv C-$. Each $R^{11}$ is preferably chosen from $C_{1-3}$ alkyl, and more preferably each $R^{11}$ is methyl. Preferably, p=1-5, more preferably p=1-3, and yet more preferably p=1. It is preferred that q=0. The arylcyclobutene group of the monomer of formula (14) can be substituted with a polar group such as described above with reference to formula (13). The substitution can be on one or more of $R^7$, $R^8$, $R^9$, $R^{10}$ or $R^{11}$.

The arylcyclobutene sensing polymer can be a homopolymer containing polymerized units of a single type of monomer of formula (13), or a copolymer (e.g., having two, three or more different polymerized unit types) containing polymerized units of one or more different types of monomer of formula (13) and/or polymerized units of one or more monomers other than a monomer of formula (13). Suitable copolymer units other than those of formula (13) include, for example, styrenic, (meth)acrylic, maleimide, or maleic anhydride units. Preferably, the sensing polymer is a copolymer of benzocyclobutene-acrylic acid (BCB-acrylic acid) and divinylsiloxane bis-benzocyclobutene (DVS-bisBCB).

Suitable exemplary arylcyclobutene monomers for use in forming the sensing polymers include following:

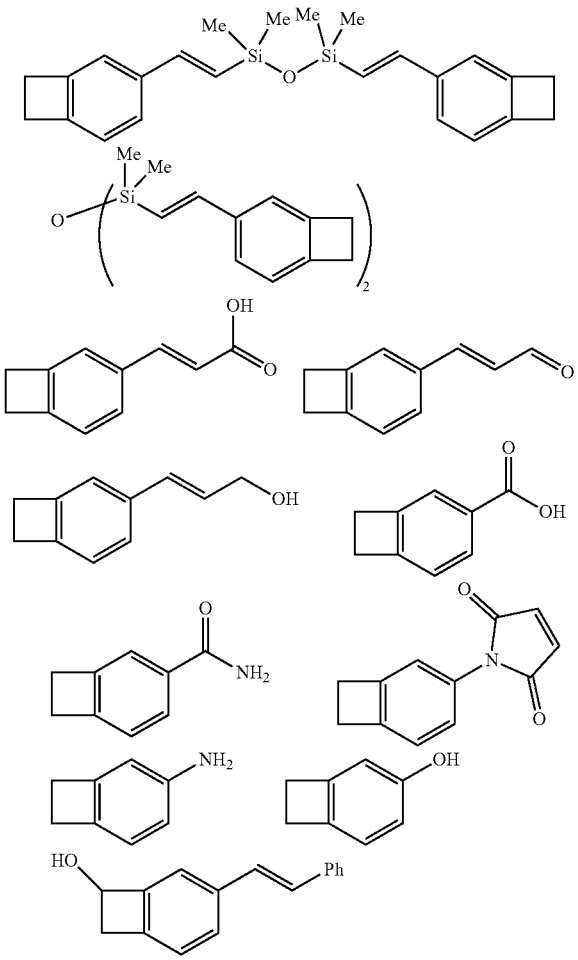

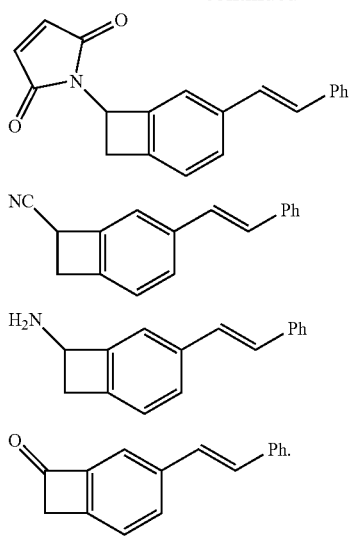

Sensing polymers formed from a monomer comprising a polar group-substituted arylcyclobutene group typically have a weight average molecular weight Mw of from 2 to 350 kDa, for example, from 2 to 100 or 2 to 50 kDa.

Suitable polymers comprising polymerized units of a monomer chosen from maleimides include polymers comprising a unit of formula (15):

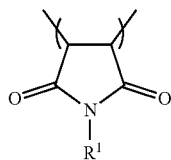

(15)

wherein $R^1$ is chosen from —H, —OH, —F, —Cl, —Br, —I, —NO$_2$, —CN, —CO$_2$H, —COR, —C(=O)NHR, —S(=O)$_2$—OR, S(=O)$_2$—NHR, C$_{1-10}$ alkyl, C$_{1-10}$ fluoroalkyl, C$_{1-10}$ perfluoroalkyl, C$_{1-10}$ hydroxyalkyl, C$_{1-10}$ aminoalkyl or C$_{1-10}$ fluorohydroxyalkyl, wherein R is chosen from C$_{1-10}$ alkyl, C$_{1-10}$ fluoroalkyl, C$_{1-10}$ perfluoroalkyl, C$_{1-10}$ hydroxyalkyl, C$_{1-10}$ aminoalkyl or C$_{1-10}$ fluorohydroxyalkyl. The maleimide polymer can be a homopolymer or a copolymer. The copolymer can include one or more different types of units of formula (15), optionally with one or more different type of monomer. Suitable exemplary maleimide copolymers include the following:

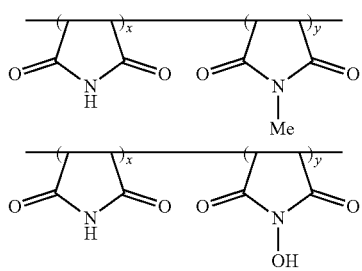

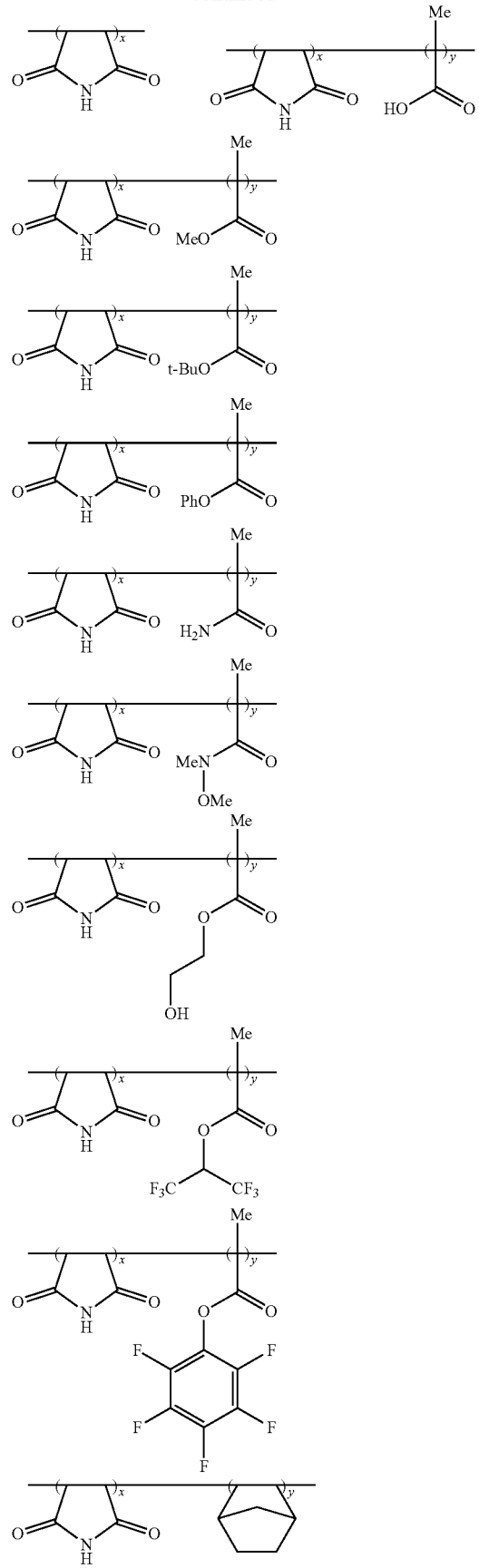

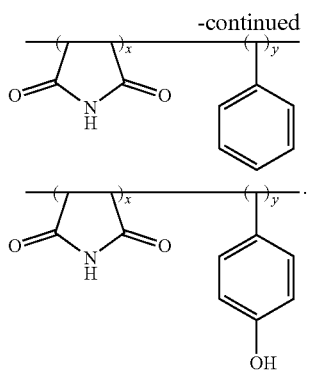

wherein x is from 1 to 100 mole % and y is from 0 to 99 mole % based on the polymerized units of the polymer. The maleimide polymers typically have a number average molecular weight Mw of from 0.5 to 25 kDa, for example, from 1 to 10 kDa.

Suitable polymers comprising polymerized units of a monomer chosen from norbornenes include polymers formed from one or more, preferably two or three, different types of monomers of formula (16):

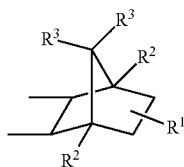

(16)

wherein: $R^1$ is independently chosen from —H, —OH, —F, —Cl, —Br, —I, —NO$_2$, —CN, —CO$_2$H, —COR, —C(═O)NHR, —S(═O)$_2$—OR, and —S(═O)$_2$—NHR, substituted (typically fluoro, hydroxy, amino, carboxy, carbonyl) or unsubstituted $C_{1-10}$ alkyl; and each of $R^2$ and $R^3$ is independently chosen from —H, —F, —Cl, —Br, —I, —NO$_2$, —CN, —C(═O)NHR, —S(═O)$_2$—OR, —S(═O)$_2$—NHR, substituted or unsubstituted $C_{1-10}$ alkyl, such as $C_{1-10}$ fluoroalkyl, $C_{1-10}$ perfluoroalkyl, $C_{1-10}$ hydroxyalkyl or $C_{1-10}$ aminoalkyl, substituted or unsubstituted $C_{3-6}$ cycloalkyl, substituted or unsubstituted $C_{6-20}$ aryl, or substituted or unsubstituted $C_{4-20}$ heteroaryl, wherein R is chosen from substituted or unsubstituted $C_{1-10}$ alkyl, such as $C_{1-10}$ fluoroalkyl, $C_{1-10}$ perfluoroalkyl, $C_{1-10}$ hydroxyalkyl, $C_{1-10}$ aminoalkyl or $C_{1-10}$ fluorohydroxyalkyl.

Suitable norbornene polymers include homopolymers and copolymers formed from one or more different monomers of formula (16), optionally with one or more additional types of monomers, for example, maleic anhydrides or maleimides. Exemplary norbornene polymers include, for example, the following:

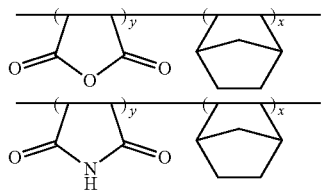

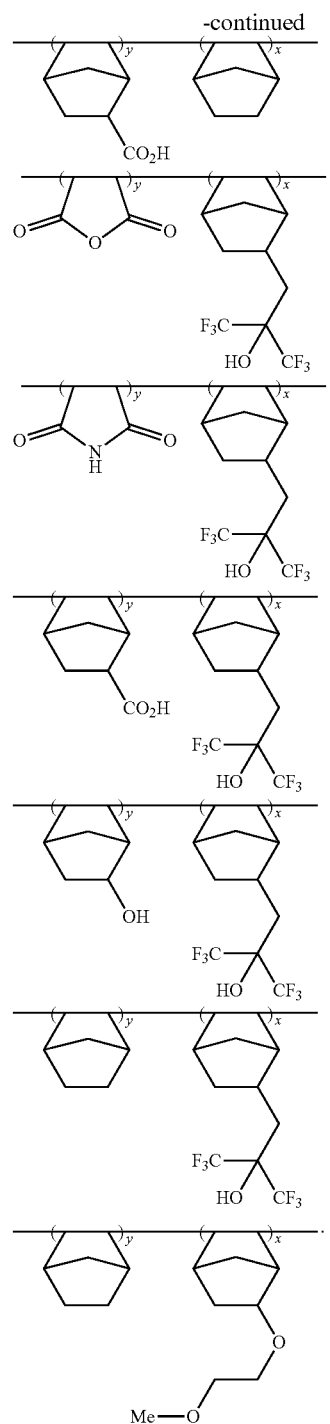

wherein x is from 1 to 100 mole % and y is from 99 to 0 mole % based on the polymerized units of the polymer. The norbornene polymers typically have a number average molecular weight Mw of from 0.5 to 25 kDa, for example, from 1 to 10 kDa.

The sensing polymers can readily be made by persons skilled in the art and/or are commercially available. The polymeric sensing layer is formed from a sensing polymer composition that comprises the sensing polymer and a solvent, and which may include one or more optional components. The sensing polymer is typically present in the sensing polymer composition in an amount of from 90 to 100 wt %, from 95 to 100 wt %, 98 to 100 wt % or 100%, based on total solids of the composition.

The solvent of the sensing polymer compositions are to allow formulation and casting of the composition. The solvent should exhibit excellent solubility characteristics with respect to the sensing polymer and other non-solvent components of the compositions. The solvent will depend on the particular polymer and other components of the sensing polymer composition. The solvent can be chosen from water, aqueous solutions, organic solvents and mixtures thereof, with organic solvents being typical. Suitable organic solvents for the sensing polymer composition include, for example: alcohols such as $C_{1-9}$ straight or $C_{3-9}$ branched or cyclic monohydric alcohol such as methanol, ethanol, n-propyl alcohol, isopropyl alcohol, 1-butanol, 2-butanol, isobutyl alcohol, tert-butyl alcohol, 2-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol, 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, and $C_{5-9}$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; esters such as ethyl lactate, methyl 2-hydroxyisobutyrate, propylene glycol methyl ether acetate, 3-methoxybutyl acetate, alkyl esters such as alkyl acetates such as n-butyl acetate, propionates such as methyl methoxypropionate, n-butyl propionate, n-pentyl propionate, n-hexyl propionate and n-heptyl propionate, and alkyl butyrates such as n-butyl butyrate, isobutyl butyrate and isobutyl isobutyrate; ketones such as acetone, methyl ethyl ketone, cyclohexanone, 2,4 dimethyl-3-pentanone, 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; aromatic hydrocarbons such as anisole, toluene, xylene and mesitylene; ethers such as isopentyl ether, propylene glycol methyl ether, dipropylene glycol monomethyl ether and tetrahydrofuran; lactones such as gamma-butyrolactone and gamma valerolactone; lactams such as N-Methyl-2-pyrrolidone; amine-containing organic solvents such as trimethyl amine, triethyl amine, triisopropyl amine, aniline, pyrrolidine, piperidine and pyridine; and mixtures containing one or more of these solvents. Of these organic solvents, alcohols, aliphatic hydrocarbons and ethers are preferred. The solvent component of the sensing polymer composition is typically present in an amount of from 80 to 99 wt %, more typically, from 90 to 99 wt % or from 95 to 99 wt %, based on the total weight of the sensing polymer composition.

The sensing polymer composition can include one or more optional components chosen, for example, from crosslinkers, surfactants, antioxidants, colorants, adhesion promoters, or combinations thereof. Such optional additives if used are each typically present in the composition in minor amounts based on total solids of the composition. The optional additives and amounts should be selected such that the sensing characteristics of the polymeric sensing layer for the analyte of interest are not adversely impacted.

Depending on the particular polymer in the sensing polymer composition, it may be desirable to include a crosslinker in the sensing polymer composition, for example, to provide improved mechanical properties such as strength or elasticity to the sensing polymer in the sensing polymer layer. Suitable crosslinkers will depend on the polymer in the sensing composition and may be chosen, for example, from: melamine compounds such as hexamethylol melamine, hexamethoxymethyl melamine, hexamethylol melamine compounds having 1 to 6 methylol groups methoxymethylated, hexamethoxyethyl melamine, hexacyloxymethyl melamine, and hexamethylol melamine compounds having 1 to 6 methylol groups acyloxymethylated; guanamine compounds such as tetramethylol guanamine, tetramethoxymethyl guanamine, tetramethylol guanamine compounds having 1 to 4 methylol groups methoxymethylated, tetramethoxyethyl guanamine, tetraacyloxyguanamine, tetramethylol guanamine compounds having 1 to 4 methylol groups acyloxymethylated, and benzoquanamine compounds; glycoluril compounds having substituted thereon at least one group chosen from methylol, alkoxymethyl and acyloxymethyl groups such as tetramethylol glycoluril, tetramethoxyglycoluril, tetramethoxymethyl glycoluril, tetramethylol glycoluril compounds having 1 to 4 methylol groups methoxymethylated, and tetramethylol glycoluril compounds having 1 to 4 methylol groups acyloxymethylated; urea compounds having substituted thereon at least one group chosen from methylol, alkoxymethyl and acyloxymethyl groups such as tetramethylol urea, tetramethoxymethyl urea, tetramethylol urea compounds having 1 to 4 methylol groups methoxymethylated, and tetramethoxyethyl urea; epoxy compounds such as such as tris(2,3-epoxypropyl)isocyanurate, trimethylolmethane triglycidyl ether, trimethylolpropane triglycidyl ether, and triethylolethane triglycidyl ether; isocyanate compounds, azide compounds; hydroxy-containing compounds; or compounds having a double bond such as an alkenyl ether group. These compounds may be used as an additive or introduced into a polymer side chain as a pendant group. A crosslinker, if used, is typically present in the sensing polymer composition in an amount of from 0.5 to 50 wt % or from 0.5 to 25 wt %/o based on total solids of the sensing polymer composition.

Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in McCutcheon's Emulsifiers and Detergents, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL and DYNOL. Additional suitable surfactants include other polymeric compounds such as the tri-block EO-PO-EO co-polymers PLURONIC 25R2, L121, L123, L31, L81, L101 and P123 (BASF, Inc.). A surfactant, if used, is typically present in the sensing polymer composition in an amount of from 0.01 to 10 wt % based on total solids of the sensing polymer composition.

An antioxidant can be included in the sensing polymer compositions to prevent or minimize oxidation of organic materials in the sensing polymer compositions. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butylhydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butylanilino)2,4-bis-octyl-thio-1,3,5-triazine, n-octadecyl-3-(4'-hydroxy-3',5'-di-tert-butylphenyl)propionate, octylated phenol, aralkyl-substituted phenols, alkylated p-cresol and hindered phenol; bis-, tris- and poly-phenols such as 4,4'-dihydroxydiphenyl, methylene-bis (dimethyl-4,6-phenol), 2,2'-methylene-bis-(4-methyl-6-tert-butylphenol), 2,2'-methylene-bis-(4-methyl-6-cyclohexylphenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-cross-linked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyldiphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl)propionate]methane. Suitable antioxidants are commercially available, for example, Irganox™ antioxidants (Ciba Specialty Chemicals Corp.). A surfactant, if used, is typically present in the sensing polymer composition in an amount of from 0.01 to 10 wt % based on total solids of the sensing polymer composition.

Colorants include, for example, dyes and pigments, and may be desired for improving one or more of measurability of the polymeric sensing layer thickness, ability to inspect coating quality, ability to align the sensing layer to the underlying substrate, or cosmetic appearance. Suitable colorants include, for example, extender pigments such as alumina hydrate, clay, barium carbonate and barium sulfate; inorganic pigments such as zinc oxide, flake white, chrome yellow, red oxide, ultramarine blue, iron blue, titanium oxide, zinc chromate, red ocher and carbon black; organic pigments such as brilliant carmine 6B, permanent red 6B, permanent red R, benzidine yellow, copper phthalocyanine blue and copper phthalocyanine green; basic dyes such as magenta and rhodamine; direct dyes such as direct scarlet and direct orange; acidic dyes such as rhoserine and metanil yellow. A colorant, if used, is typically present in the sensing polymer composition in an amount of from 0.01 to 10 wt % based on total solids of the sensing polymer composition.

Use of an adhesion promoter in the sensing polymer compositions for improving adhesion of the polymeric sensing layer to the underlying substrate. The adhesion promoter can be chosen, for example, from: sulfur-containing compounds such as dithioglycerol, bis (2,3-dihydroxypropylthio)ethylene, sodium 3-(2,3-dihydroxypropylthio)-2-methyl-propylsulfonate, 1-thioglycerol, sodium 3-mercapto-1-propanesulfonate, 2-mercaptoethanol, thioglycolic acid, and 3-mercapto-1-propanol; aromatic hydroxy compounds such as phenol, cresol, xylenol, pyrocatechol, tort-butylcatechol, resorcinol, hydroguinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, aminophenol, aminoresorcinol, p-hydroxybenzoate, o-hydroxybenzoic acid, 2,4-dihydroxybenzoic acid, 2,5-dihydroxybenzoic acid, 3,4-dihydroxybenzoic acid, 3,5-dihydroxybenzoic acid, and gallic acid; benzotriazole-based compounds such as benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, methyl 1-benzotriazole carboxylate, 5-benzotriazole carboxylic acid, 1-methoxy-benzotriazole, 1-(2,2-dihydroxyethyl)-benzotriazole, 1-(2,3-dihydroxypropyl) benzotriazole or 2,2'-{[(4-methyl-1H-benzotriazole-1-yl) methyl]imino}bisethanol, 2,2'-{[(5-methyl-1H-benzotriazole-1-yl) methyl]imino}bisethanol, 2,2'-{[(4-methyl-1H-benzotriazole-1 yl)methyl]imino}bisethane, and 2,2'-{[(4-methyl-1H-benzotriazole-1-yl) methyl]imino}bispropane; triazine-based compounds such as 1,3,5-triazine-2,4,6-trithol, and silicon-containing compounds such as 1,3,5-triazine-2,4,6-trithol. An adhesion promoter, if used, is typically present in the sensing polymer composition in an amount of from 0.05 to 10 wt % based on total solids of the sensing polymer composition.

The sensing polymer compositions can be prepared following known procedures. For example, the compositions can be prepared by dissolving the sensing polymer and other optional solid components of the composition in the solvent components. The desired total solids content of the compositions will depend on factors such as the particular polymer (s) in the composition and desired final thickness of the polymeric sensing layer. Typically, the solids content of the sensing polymer compositions is from 1 to 20 wt %, more typically from 1 to 10 wt % or from 1 to 5 wt %, based on the total weight of the sensing polymer composition.

During sensor formation, the sensing polymer compositions can be applied by spin-coating, dipping, drop-casting, roller-coating, screen printing, ink-jet printing, gravure or other conventional coating techniques. Of these coating techniques, spin-coating is typical. For spin-coating, the solids content of the sensing polymer composition can be adjusted to provide a desired film thickness based upon the specific coating equipment utilized, the viscosity of the solution, the spin-speed of the coating tool and the amount of time allowed for spinning.

The polymeric sensing layer 104 is typically cured at elevated temperature to remove substantially all of the solvent from the layer, thereby forming a tack-free coating and improving adhesion of the layer to the underlying structure. Depending on the particular polymer and components of the composition, the cure may cause further change to the polymer, for example, through one or more of oxidation, outgassing, polymerization, condensation, or cross-linking. The cure is typically conducted on a hotplate or in an oven. The cure can be conducted, for example, in an atmosphere of air or inert gas such as nitrogen or argon, or can be conducted under vacuum. The temperature and time for the cure will depend, for example, on the particular polymer and solvent of the composition, and the layer thickness. Typical cure temperatures are from 100 to 300° C., from 140 to 250° C., or from 160 to 230° C. Typical cure times of from about 30 to 90 seconds. The cure can be conducted in a single step or in multiple steps. The cure can be conducted by heating the polymeric sensing composition layer at constant temperature or with a varied temperature profile such as a ramped or terraced temperature profile.

While the desired thickness of the polymeric sensing layer will depend on the particular sensing polymer, sensor type and geometry, typical thickness for the polymeric sensing layer will be from 10 to 1000 nm, from 50 to 500 nm or from 100 to 400 nm. If a thicker polymeric layer is desired, the coating and optional cure can be repeated one or more additional times. However, the upper limit on thickness of the polymeric sensing layer will depend, for example, on oscillation capability of the piezocrystal layer, with a thicker layer typically inhibiting oscillation.

Without limitation thereto, acoustic wave sensors in accordance with the invention to which polymeric sensing layers can be applied include, for example, bulk acoustic wave sensors such as quartz-crystal microbalance and film bulk acoustic resonator sensors, and surface acoustic wave sensors. Such sensors types, and acoustic wave sensors in general, as well as their manufacture, are known in the art and described, for example, in D. S. Ballantine et al, *Acoustic Wave Sensors Theory, Design, and Physico-Chemical Applications*, Academic Press (1997), G. Korotcenkov, *Handbook of Gas Sensor Materials: Properties, Advantages and Shortcomings for Applications Volume* 1: *Conventional Approaches, Integrated Analytical Systems*, Springer (2013). Application of polymeric sensing layers as described herein to acoustic wave sensors can allow for sensing of gas-phase analytes include, for example, one or more of toluene, ethanol, formaldehyde, acetaldehyde, acetone, acetic acid, alkyl amines such as triethylamine, alkyl thiols such as pentanethiol, or hydrogen sulfide. The sensors are particularly suited for the sensing of organic materials.

According to the invention, any piezoelectric material (crystal) which exhibits a piezoelectric effect can be used for the piezoelectric layer. Typical piezoelectric materials include, for example, gallium phosphate, quartz, tourmaline, barium titanate, magnesium niobate-lead titanate, lead-zirconate titanate, lithium niobate, lithium tantalite, aluminum nitrate, or zinc oxide. Typically, the piezoelectric material has a fundamental mode in a frequency range of from 20 kHz to 100 MHz, typically from 0.1 to 50 MHz, and more typically from 0.1 to 30 MHz. Optionally, detection using harmonics can be used in a higher frequency range, for example, from 1 MHz to 20 GHz, or from 30 MHz to 500 MHz.

Depending on sensor type and design, the polymeric sensing layer may be disposed over the piezoelectric layer, either directly on (i.e., in physical contact with) or with one or more intervening layers between it and the piezoelectric layer. In some sensor designs, the polymeric sensing layer may be disposed over an electrode of the sensor which in turn may be disposed over the piezoelectric layer, such as in certain QCM or FBAR sensors. In some sensor designs, the polymeric sensing layer may be disposed between electrodes, such as in a SAW sensor.

Without limitation thereto, the invention will further be described with reference to FIGS. 1-3, which illustrate exemplary acoustic wave sensors in accordance with the invention. FIG. 1 illustrates in cross-section an illustrative QCM sensor which includes a quartz crystal (piezoelectric) resonating layer (crystal) 100, a front (i.e., sensing side) electrode 102 over a front surface of the resonating layer, a rear electrode 103 over a rear surface of the resonating layer, and a polymeric sensing layer 104 as described herein disposed over the front electrode 102. The electrodes are made of a metal, typically gold or titanium, and can be formed by a metallization process such as plating, sputtering or evaporation. The QCM further includes a metal quartz crystal holder (not shown), a power supply 106, an oscillator 108, a frequency counter 110, and a computer 112, for control and measurement of resonant frequency. Analyte detection can be conducted by measuring the frequency shift caused by mass loading of the polymeric sensing layer with the analyte. Knowledge of the chemical affinity of the sensing layer for the analyte molecules allows for correlation of resonant frequency shift to analyte concentration. The operating frequencies of QCM sensors of the invention are typically from 5 to 300 MHz. QCM sensors are known in the art (e.g., U.S. Pat. No. 6,156,578A) QCM sensors in accordance with the invention can be made by persons skilled In the art. Additionally, QCM sensors suitable for use in forming a sensor in accordance with the invention are commercially available, for example, those available from Stanford Research Systems and Inficon. Also commercially available are microbalances using piezoelectric materials other than quartz, for example, langasite and gallium phosphate. Such commercial sensors can be modified by applying a layer of a sensing polymer composition as described herein over the front electrode 102 to form polymeric sensing layer 104.

Figure 2:
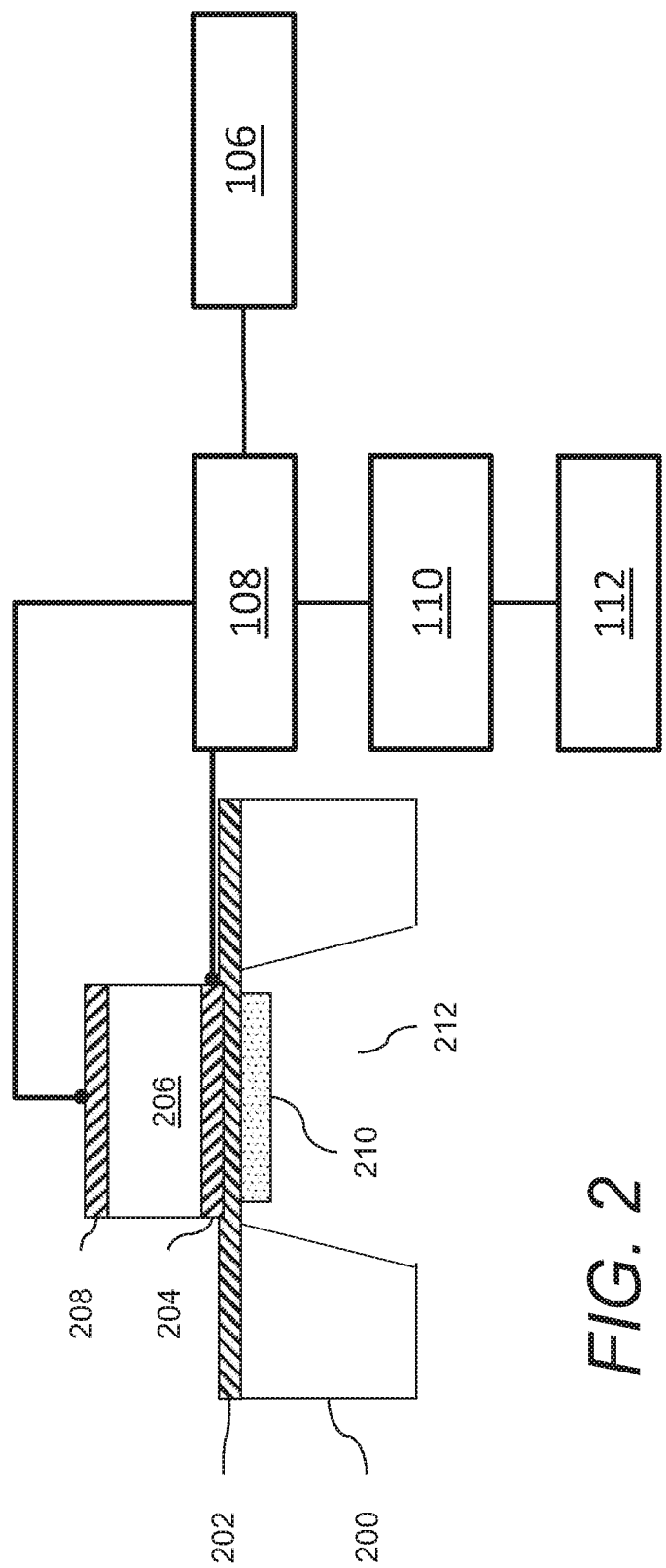
FIG. 2 illustrates in cross-section a film bulk acoustic resonator sensor in accordance with the invention.

FIG. 2 illustrates in cross-section an exemplary film bulk acoustic resonator (FBAR) sensor in accordance with the invention. The FBAR sensor includes a substrate 200, typically formed from single-crystal silicon, on which is disposed an insulating layer 202, a front (i.e., sensing side) electrode 204, a piezoelectric layer 206, rear electrode 208, and a polymeric sensing layer 210 as described herein disposed in cavity 212 formed in the substrate. FBAR sensors are typically formed by silicon micromaching techniques known to those skilled in the art (e.g., A. Lin et al, "Explosive trace detection with FBAR-based sensor," 2008 IEEE 21st International Conference on Micro Electro Mechanical Systems, Tucson, Ariz., 2008, pp. 208-211). An exemplary fabrication process includes deposition of the insulating layer 202, typically low stress LPCVD silicon nitride, on a single-crystal silicon wafer 200. The nitride on the front side of the wafer is typically patterned in a photolithographic process (e.g., photoresist coating, exposure and development) to form openings in the resist. The exposed portion of the silicon substrate is next etched, typically by wet-etching such as with a KOH solution, to form cavity 212 in the silicon front surface. Front electrode 204 can next be formed, for example, by evaporation and then patterned. A typical electrode material is gold, with chromium as an adhesive layer. The piezoelectric layer 206, for example, a ZnO layer, can next be sputter-deposited and patterned. The rear electrode 208 can next be formed (e.g., a layer of gold over chromium) by evaporation followed by patterning such as by lift-off technique. The polymeric sensing layer 210 can next be formed as described herein on the insulating layer on the wafer front side in cavity 212. The FBAR sensor further includes a power supply 106, an oscillator 108, a frequency counter 110, and a computer 112, for control and measurement of resonant frequency. Analyte detection and measurement can be conducted in a similar manner to that described for the QCM. The operating frequencies of FBAR sensors of the invention are typically from 500 MHz to 20 GHz. QCM sensors are known in the art (e.g., U.S. Pat. No. 6,156,578A) QCM sensors in accordance with the invention can be made by persons skilled In the art. Additionally, QCM sensors suitable for use in forming a sensor in accordance with the invention are commercially available, for example, those available from Stanford Research Systems and Inficon. Also commercially available are microbalances using piezoelectric materials other than quartz, for example, langasite and gallium phosphate. Such commercial sensors can be modified by applying a layer of a sensing polymer composition as described herein over the front electrode 102 to form polymeric sensing layer 104.

Figure 3:
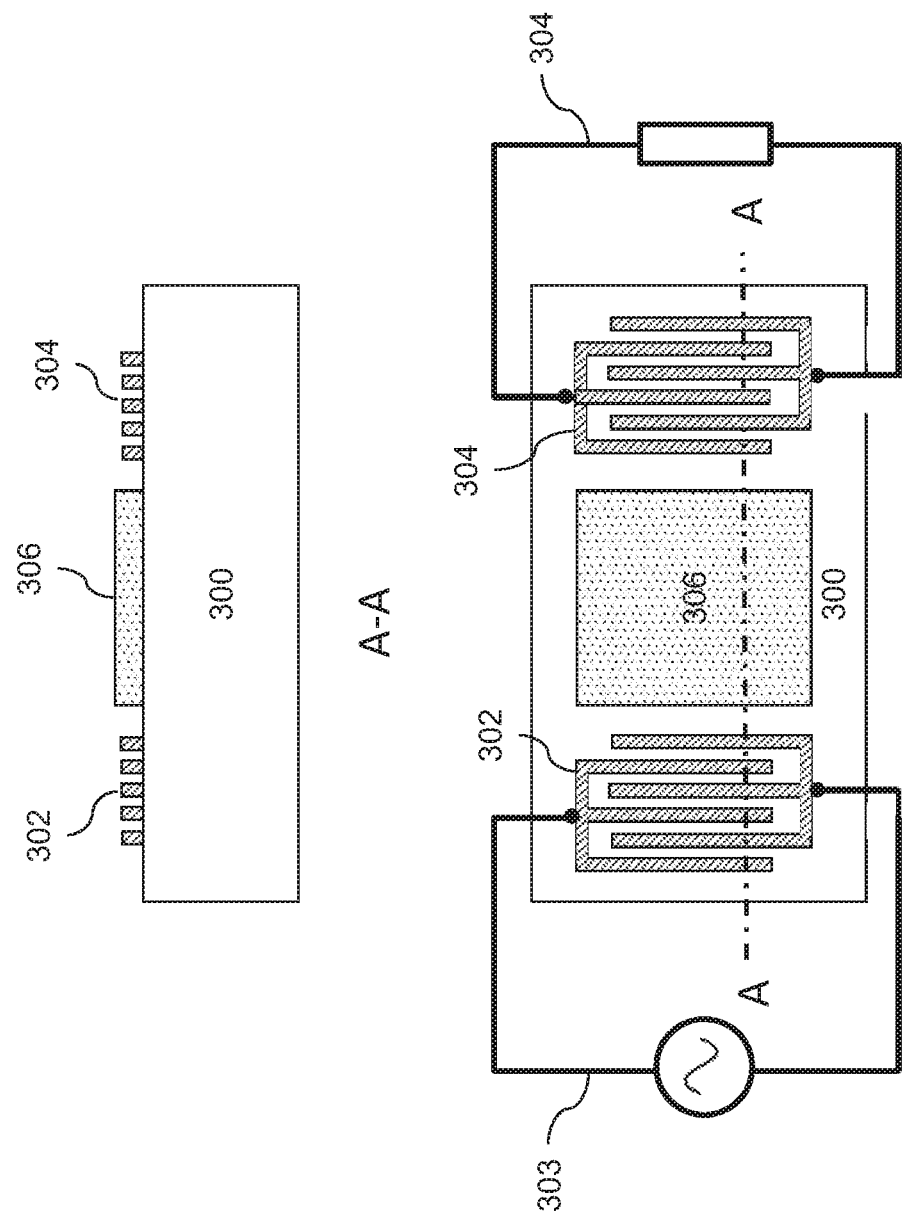
FIG. 3 illustrates in cross-section and top-down view a surface acoustic wave sensor in accordance with the invention.

FIG. 3 illustrates in cross-section and top-down view an exemplary surface acoustic wave sensor in accordance with the invention. The SAW sensor includes a piezoelectric substrate (layer) 302, an input interdigitated transducer (IDT) 302, an input electrical circuit 303, an output interdigitated transducer 304, and an output electrical circuit 304. Typical materials for the piezoelectric substrate include, for example, quartz, lithium niobate, lithium tantalite, aluminum nitride, or zinc oxide. The input IDT and output IDT comprise a thin film interdigitated electrode pattern formed over the piezoelectric layer 300. These structures are typically formed by depositing a thin metal layer on the piezoelectric substrate, followed by lithographically patterning the metal film. Typical materials for the IDTs are gold on chromium and aluminum. The thickness of the transmitter and receiver electrodes are typically from 100 to 200 nm. A polymeric sensing layer 306 as described herein is provided over the piezoelectric layer 300 and is disposed between the transmitter electrode 304 and receiver electrode 306.

SAW sensors of the invention can be made by methods known to those skilled in the art. SAW sensors are described, for example, in U.S. Pat. No. 9,329,154B1. The SAW sensor can include additional transducers and/or additional circuits. When the IDT 302 is stimulated by the input electrical circuit 303, the IDT 303 as part of a piezoelectric circuit with the piezoelectric substrate, converts electrical charge to mechanical deformation of the substrate surface at an oscillating frequency related to the alternating frequency of an input electrical signal. The input electrical signal generates a surface acoustic wave through the inverse piezoelectric effect that propagates through the piezoelectric substrate 300. When the surface acoustic wave impacts the output IDT 304, the surface acoustic wave is converted back into an electrical signal by the direct piezoelectric effect which generates an output electrical signal at the output IDT 304. The magnitude of the output electrical signal is directly related to the magnitude of the surface acoustic wave. As discussed above, the polymeric sensing layer 306 is capable of selectively interacting with a gas-phase analyte of interest. When molecules of the analyte are adsorbed by the polymeric sensing layer, the mass density of the sensing layer increases. Such increase alters or retards propagation of the surface acoustic wave through the SAW device, which may be registered, for example, as a phase shift in the surface acoustic wave that is directly proportional to the amount of adsorbed analyte.

Acoustic wave sensors of the invention can be used by exposing the polymeric sensing layer to an atmosphere comprising a gas-phase analyte of interest, and the resonant frequency of the sensor can be monitored in response to the presence of the gas-phase analyte on the polymeric sensing layer. The change in signal can, via downstream processors, be converted directly into changes in mass and can be visualized on a display. Suitable analytes include, for example, one or more of toluene, ethanol, formaldehyde, acetaldehyde, acetone, acetic acid, alkyl amines such as triethylamine, alkyl thiols such as pentanethiol, or hydrogen sulfide. Sensors of the invention are particularly suited to measure organic analytes. Suitable analytes include those in gas or vapor (collectively, gas) form for adsorption to the polymeric sensing layer. The analyte is typically in gas or liquid phase at room temperature. Liquid analytes are typically heated to increase their gas-phase concentration to promote interaction with the polymeric sensing layer.

Figure 4:
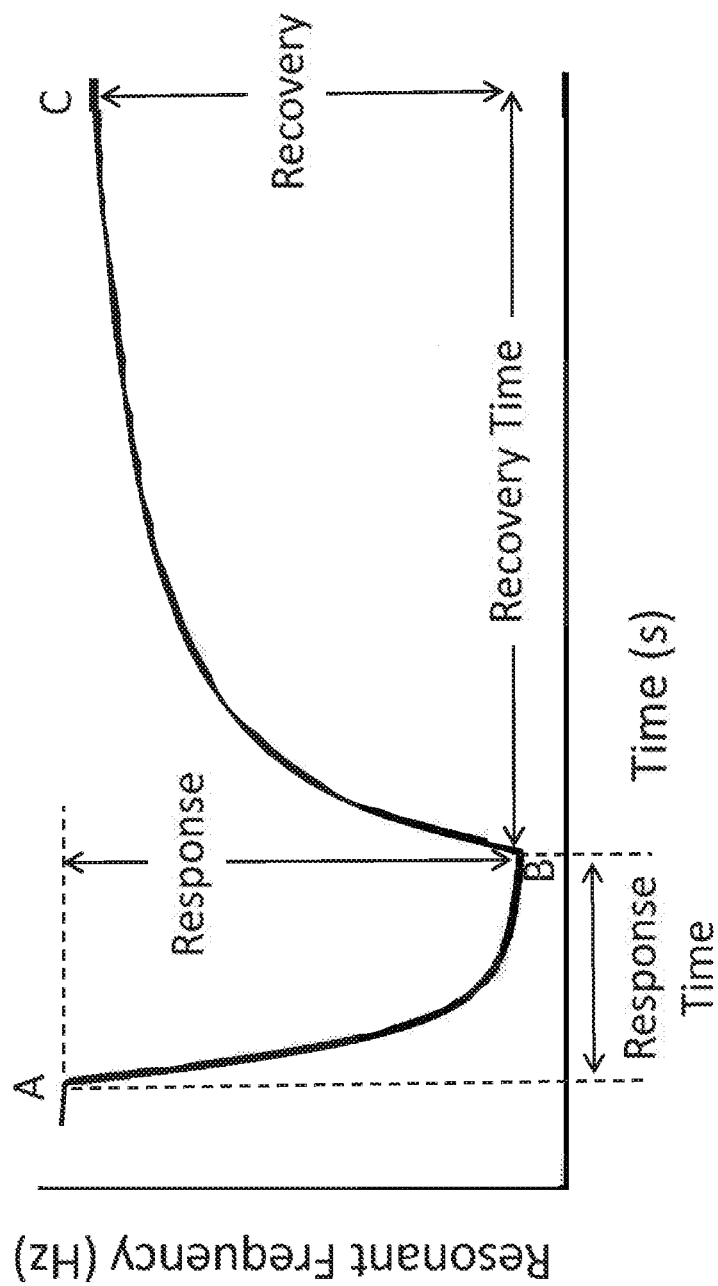
FIG. 4 is a representative plot of resonant frequency vs. time showing response to an analyte and recovery of an acoustic wave sensor in accordance with the invention.

Preferable acoustic wave sensors of the invention can serve repeated uses for sensing an analyte of interest. In such case, the interaction between the analyte and polymeric sensing layer is reversible. FIG. 4 is a representative plot of resonant frequency vs. time showing response and recovery to an analyte of a preferred acoustic wave sensor in accordance with the invention. As shown in this illustrative aspect, the sensor exhibits an initial baseline resonant frequency at reference A prior to being dosed with the analyte. Exposure of the sensor to the analyte begins at reference A until reaching full response at reference B. The reduction in resonant frequency is an indication of interaction between the analyte and polymeric sensing layer. Such interaction is believed to be due to the sensing layer having an affinity for, but not forming a covalent bond with, the analyte at the desired operating temperature of the sensor. Without wishing to be bound by any particular theory, such interaction is believed to be one or more of physisorption, chemisorption, co-miscibility, charge-coupled complexation, hydrogen bonding, ionic bonding, and the like. Dosage of the analyte is then terminated, with the sensor being exposed to atmosphere, inert gas or other ambient conditions essentially free of the analyte. As the interaction between the analyte and polymeric sensing layer begins to reverse, for example, by desorption or dissociation, the resonant frequency increases with time until reaching a new baseline level at reference C. The new baseline level resonant frequency may be the same as or different from the original baseline level depending, for example, on strength of polymer-analyte interaction, pre- and post-dosing changes in humidity or modulus, e.g., shear and/or elastic as a result of analyte-sensing polymer film interactions, or azeotropic analyte removal. With reference to FIG. 4, "Response" is the change in measured resonant frequency (Hz) of the sensor from the initial (pre-dose) baseline to the full response value for the analyte. "Recovery" is the change in measured resonant frequency (Hz) of the sensor from full response to the new baseline C after purging the analyte from the sensor. "Recovery Time" is the time taken for the polymeric sensing layer to reach the new baseline level at reference C from full response at reference B. The percent recovery is equal to the ratio of Recovery/Response for a given analyte. Preferable sensors in accordance with the invention can exhibit 50% or greater recovery, more preferably, 60% or greater recovery, 70% or greater recovery, 80% or greater recovery, or 90% or greater recovery. Preferably, such recoveries are achieved within a time of 90 minutes, more preferably within 60 minutes, within 30 minutes, or within 15 minutes. Preferably, such recoveries take place at room temperature (e.g., 20-30° C.), but may be conducted at a higher temperature, for example, at a temperature of up to 100° C. The temperature limit for a given sensor will depend, for example, on the materials of construction of the sensor, such as on properties of the polymeric sensing layer (e.g., glass transition temperature of the polymer). If used, sensor heating can be conducted, for example, by use of an internal or external heater, or by use of a heated purge gas for contacting the polymeric sensing layer. A sensor recovery of 50% or greater within a time of 90 minutes at room temperature is typical.

These characteristic allow sensors of the invention to be used repeatedly. For example, sensors of the invention can be exposed to a second atmosphere effective to reduce the content of the gas-phase analyte in the sensor. The resonant frequency of the acoustic wave sensor is allowed to recover to a baseline frequency. The sensor can then be exposed to a third atmosphere comprising a gas-phase analyte. This gas-phase analyte can be the same or different from that sensed in the prior measurement. This sequence of measurements can be repeated one or more times.

The following non-limiting examples are illustrative of the invention.

EXAMPLES

Sensing Polymer Synthesis

The following polymers were synthesized using the procedures described below. Number average molecular weight (Mn), weight average molecular weight (Mw) and polydispersity (PDI=$M_w/M_n$), where reported, were determined by gel permeation chromatography (GPC) based on polystyrene standard.

Polymer G=poly(benzocyclobutene-acrylic acid-co-divinyl-siloxane bis(benzocyclobutene)).

Synthetic Example 1

A 4-liter cylindrical reactor was charged with 485.010 g diphenylene oxide bis(triphenylcyclopentadienone) (DPO-CPD), 27.370 g of 3,5-diethynylbenzoic acid (DEBzOH), and 2422 g of γ-butyrolactone (GBL) at room temperature. The top of the flask was then equipped with a dry ice condenser, a thermocouple with a temperature controller, $N_2$ inlets, and a stir system. The reactor was placed into a fitted heating mantle. The system was evacuated and purged three times with $N_2$ to remove air from the vessel, which was subsequently blanketed with a constant flow of $N_2$. The reaction system was then heated to an internal temperature

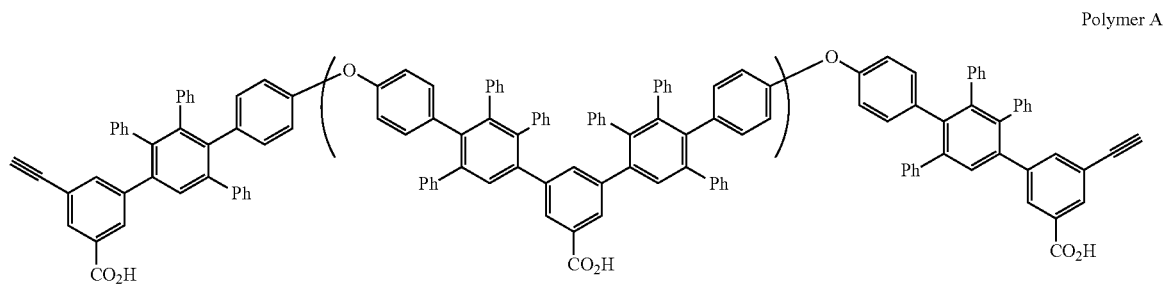

Polymer A

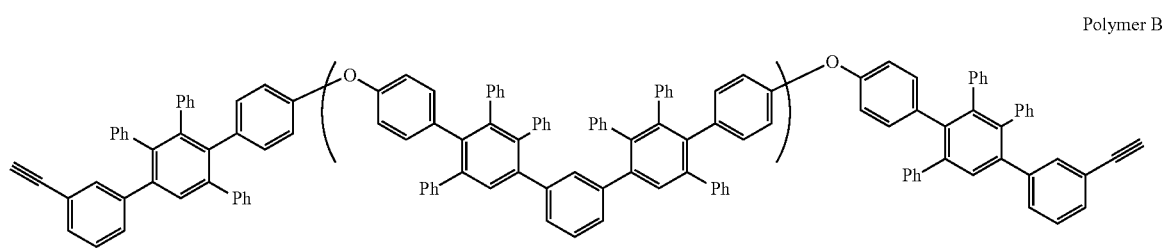

Polymer B

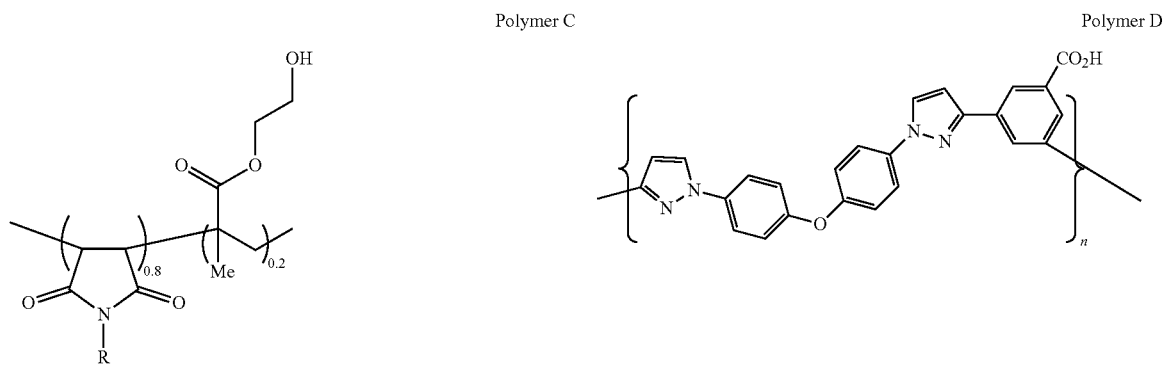

Polymer C

Polymer D

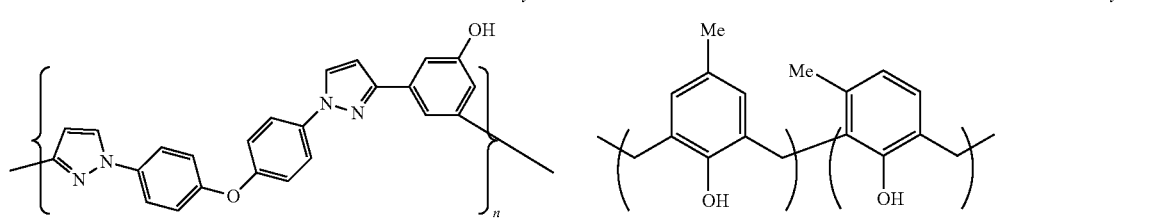

Polymer E

Polymer F of 135° C. After 1 hour, the system was allowed to cool to 90° C., followed by adding a second aliquot (27.780 g) of DEBzOH to the flask, together with an additional 300 g of GBL. The reaction mixture was again heated to 135° C. and kept at this temperature for 1 hour. The system was again allowed to cool to 90° C., followed by adding a third aliquot (27.110 g, 0.25 equivalents) of DEBzOH to the flask, along with an additional 330 g GBL. The reaction mixture was again heated to 135° C. and kept at this temperature for 1 hour, after which time the system was again allowed to cool to 90° C., followed by adding a fourth aliquot (30.763 g, 0.29 equivalents) of DEBzOH to the flask, together with an additional 330 g GBL. The reaction mixture was again heated to 135° C. and kept at this temperature for 6 hours. The reaction mixture was then cooled to room temperature. The resulting diethynylbenzoic acid-biscyclopentadienyl polyarylene polymer (Polymer A) was isolated from the reaction mixture by precipitating it from solution by adding isopropanol at room temperature, filtered, and washed with additional isopropanol before the filtrate was dried at 70° C. for 24 hours. This solid polymer (0.2 g) was then dissolved in 9.8 g propylene glycol methyl ether acetate. [Polymer A: $M_n$=10.26 kDa; $M_w$=21.33 kDa: PDI=2.08].

Synthetic Example 2

DPO-CPD (109.42 g) and 1,3-diethynylbenzene (18.34 g) were added to a 1 L OptiMax reactor (glass lined, with TEFLON™ fluoropolymer drainage plug). Ethoxybenzene solvent (309 g) was added to form a deep maroon heterogeneous mixture. The reactor was transferred to an OptiMax Synthesis Workstation and sealed under an atmosphere of nitrogen gas. To the reactor top were affixed a stirring rod with a 4-paddle stirrer (elevated to 1 cm from the reactor bottom), a water-cooled reflux condenser, an internal thermocouple (placed at the median depth of the mixture, radially disposed halfway between the stirring shaft and the reactor wall), and a 1 cm baffle (placed perpendicular and adjacent to the outer wall of the reactor). The reactor was set to an internal temperature of 25° C. and stirring was initiated at 100 rpm to mix the heterogeneous contents. After a 30 minute equilibration period at 25° C., the reactor was warmed at a rate of 1° C./min. until reaching an internal temperature of 115° C. Upon reaching 115° C., the reactor temperature was maintained at 115° C. for a period of 18 hours. The reactor was then cooled from 115° C. to 25° C. at a rate of 1° C./min. The contents of the reactor were then transferred through the outlet at the bottom of the reactor to a 450 mL bottle, yielding Polymer B. 1 g of this solution was diluted with 9 g anisole. [Polymer B: $M_n$=37.02 kDa; $M_w$=105.95 kDa; PDI=2.86].

Synthetic Example 3

20.0 g THF solvent was added to a 100 ml round bottom 3-neck flask. The flask was then heated and maintained at 66° C. with stirring. 16.0039 g maleimide, 4.0442 g 2-hydroxyethyl methacrylate (HEMA) and 30.0350 g of THF were added to a glass bottle. The bottle was gently shaken to provide a uniform solution, and was then placed in a water-ice bath to reach temperature equilibrium with the bath. 0.6214 g of V-65 azo initiator (Wako Specialty Chemicals) was added to the bottle. The bottle was vigorously shaken to dissolve the initiator and the bottle was then placed back in the bath. The monomer/initiator solution was fed into the flask at a rate of 250 l/23 sec using a Hamilton Microlab 500 syringe delivery system. The flask was maintained at 66° C. for an additional 2 hours after completion of the monomer/initiator solution feed. 27.3510 g of ethyl lactate was added to the flask to dilute the polymer solution. The polymer solution was transferred to a 250 mL single neck flask and rotovaped at 50° C. to remove the THF. A solution of poly(maleimide-co-hydroxyethylmethacrylate) polymer (Polymer C) (28.8 wt %) in ethyl lactate was obtained. 1.0 g of this solution was diluted in 9 g ethyl lactate. [Polymer C: $M_n$=1291 Da; $M_w$=1794 Da; PDI=1.39].

Synthetic Example 4

A 20 mL vial equipped with a stir bar was charged with 2 g 3,3'-(oxydi-4,1-phenylene)bis-sydnone) (ODAS), 1.01 g of 3,5-diethynylbenzoic acid (DEBzOH), and 12 g of GBL at room temperature. The vial was then heated to 135° C. for 24 hours. The reaction mixture was then cooled to room temperature. The resulting reaction solution was slowly poured into 500 mL of vigorously stirred water, resulting in the precipitation of a solid polymer. The solid polymer was filtered, washed with additional water and the filtrate dried at 65° C. for 24 hours to provide an ODAS-DEBzOH polypyrazole (Polymer D). 0.2 g of this solid were dissolved in 9.8 g tetrahydrofuran. [Polymer D: $M_n$=1.82 kDa; $M_w$=10 kDa; PDI=5.5].

Synthetic Example 5

A 20 mL vial equipped with a stir bar was charged with 1 g 3,3'-(oxydi-4,1-phenylene)bis-sydnone) (ODAS), 0.42 g of 3,5-diethynyl phenol (DEPOH), and 5.68 g of GBL at room temperature. The vial was then heated to 135° C. for 24 hours. After this period, the reaction mixture was then cooled to room temperature. The resulting reaction solution was slowly poured into 500 mL of vigorously stirred water, resulting in the precipitation of a solid polymer. The solid polymer was filtered, washed with additional water and the filtrate dried at 65° C. for 24 hours to provide an ODAS-DEP polypyrazole (Polymer E). 0.2 g of this solid were dissolved in 9.8 g tetrahydrofuran. [Polymer E: $M_n$=1.4 kDa; $M_w$=4.1 kDa; PDI=2.9].

Synthetic Example 6

A 100 L reactor was charged with m-cresol (20.50 kg) and p-cresol (49.20 kg) before being heated to 40° C. for 24 h. 2,5-xylenol (13.90 kg) was added to the mixture via funnel, followed by oxalic acid dihydrate (1.50 kg), and the funnel was rinsed with deionized water (1.0 kg), the water being added to the reactor. The reactor was purged of air and placed under a nitrogen atmosphere. 8.20 kg of a formalin (37 wt % in water)/methanol mixture (89 wt % 11 wt %) was then added to the reactor followed by an additional funnel rinse with deionized water (1.50 kg). The reactor was heated to a temperature of 100° C. for 1 hour, during which an additional 32.80 kg of the same formalin/methanol mixture was added, followed by additional water (1.50 kg). A 4-hour isothermal hold was then conducted at 105° C. A vacuum distillation was next initiated to remove solvent. The hot liquid-phase polymer was cooled to 180° C. before additional cooling by a pump addition of ethyl lactate (104.0 kg). The alternating cresol-novolac polymer (Polymer F) solution (173.5 kg) was cooled to room temperature and filtered over a nylon frit before being packaged in plastic lined drums. 1 g of this polymer formulation in ethyl lactate was added to 9 g propylene glycol methyl ether acetate. [Polymer F: $M_n$=1.45 kDa; $M_w$=3.48 kDa; PDI=2.40]

Synthetic Example 7

3.11 kg of benzocyclobutene-acrylic acid (BCB-acrylic acid) and 2.85 kg of divinylsiloxane bis-benzocyclobutene (DVS-bisBCB) were heated in 8.64 kg of Proglydem DMM Dipropylene Glycol Dimethyl Ether (The Dow Chemical Company) at 155-175° C. until a $M_w$ of 5500 g/mol was reached. 0.146 kg of water were then added to the reaction mixture. Post-reaction water was removed by distillation at 110-120° C. to less than 2000 ppm as measured by Karl Fisher titration, yielding an oligomer content of 40 wt % solids based on the total reaction mixture. Further dilution in PGMEA to a total concentration of 10 wt % solids was performed with a small quantity of material to provide the formulation used in 70:30 poly(BCB-acrylic acid-co-DVS-bisBCB) polymer (Polymer G). [Polymer G: $M_n$=2.34 kDa; $M_w$=6.32 kDa; PDI=2.70].

Sensing Polymer Composition Preparation

Sensing polymer compositions were prepared by combining the polymer compositions and solvents in the weight percentages set forth in Table 1 in 20 mL scintillation vials. The mixtures were agitated until a solution formed.

TABLE 1

| Example | Sensing Polymer Composition | Polymer Composition | Solvent | Polymer content (wt %) |
|---|---|---|---|---|
| 1 | SC-1 | Synthetic Ex. 1 (Polymer A) | PGMEA | 4 |
| 2 | SC-2 | Synthetic Ex. 2 (Polymer B) | Anisole | 4 |
| 3 | SC-3 | Synthetic Ex. 3 (Polymer C) | PGMEA | 4 |
| 4 | SC-4 | Synthetic Ex. 4 (Polymer D) | THF | 2 |
| 5 | SC-5 | Synthetic Ex. 5 (Polymer E) | THF | 2 |
| 6 | SC-6 | Synthetic Ex. 6 (Polymer F) | EL | 2 |
| 7 | SC-7 | Synthetic Ex. 7 (Polymer G) | PGMEA | 2 |
| 8 | SC-8 | Polymer H | GBL | 10 |
| 9 | SC-9 | Polymer I | NMP | 4 |
| 10 | SC-10 | Polymer J | NMP | 4 |

TABLE 1-continued

| Example | Sensing Polymer Composition | Polymer Composition | Solvent | Polymer content (wt %) |
|---|---|---|---|---|
| 11 | SC-11 | Polymer K | PGMEA | 5 |
| 12 | SC-12 | Polymer L | MBA | 4 |

Polymer A = Diethynylbenzoic acid-biscyclopentadienyl polyarylene (Synthetic Example 1); Polymer B = Diethynylbenzene-biscyclopentadienyl polyarylene (Synthetic Example 2); Polymer C = Poly(maleimide-co-hydroxyethylmethacrylate) (Synthetic Example 3); Polymer D = ODAS-DEBzOH polypyrazole (Synthetic Example 4); Polymer E = ODAS-DEP polypyrazole (Synthetic Example 5); Polymer F = Cresol novolac polymer (Synthetic Example 6); Polymer G = 70:30 poly(BCB-acrylic acid-co-divinylsiloxybis-BCB) (Synthetic Example 7); Polymer H = SiLK™ J polyarylene resin (The Dow Chemical Company); Polymer I = PI-2611™ polyimide (HD Microsystems), uncured; Polymer J = PI-2611™ polyimide (HD Microsystems), cured; Polymer K = CYCLOTENE™ 6505 resin (MicroChem Corp.); Polymer L = CYCLOTENE™ 4022 resin (MicroChem Corp.); GBL = γ-butyrolactone; NMP = N-Methyl-2-pyrrolidone; THF = tetrahydrofuran; PGMEA = Propylene glycol monomethyl ether acetate; EL = Ethyl lactate; MBA = 3-Methoxybutyl Acetate.

Sensor Preparation

QCM Gas sensors were prepared by spin-coating sensing polymer compositions on a respective 1-inch quartz crystal with Cr/Au electrode (Stanford Research Systems O100RX1) or Ti electrode (Inficon 750-1029-G 1) as specified in Table 2 at 1500 rpm for 30 seconds on a Laurell WS-650MZ-8NPPB spin-coater. The sensing polymer layers were annealed on a hot plate at the conditions set forth in Table 2.

Analyte Sensing Procedure

A respective polymeric film-coated QCM component prepared as described above was placed in a crystal holder and disposed in a 7 L Pyrex testing chamber of the QCM system at a depth of 4 inches from the top. A pre-dose baseline resonant frequency $f_{pd}$ (reference A in FIG. 4) was established and the testing chamber was dosed with 1 μL of a liquid-phase analyte as specified in Table 2. The analyte was agitated by a magnetic stirrer to disperse and diffuse the liquid through the chamber in the vapor phase. The QCM was allowed to respond to the dosage via resonant frequency shift from the pre-dose baseline resonant frequency until reaching full-response resonant frequency (reference B in FIG. 4). The testing chamber was vented to atmosphere and the resonant frequency of the sensor was allowed to recover until the earlier of reaching a constant post-dose baseline frequency (reference C in FIG. 4) or 90 minutes. The response, determined as pre-dose baseline resonant frequency minus full-response resonant frequency, and recovery, determined as earlier of post-dose baseline or 90 minute resonant frequency minus full-response resonant frequency) were normalized in relation to the molar concentration of the analyte dose. The results for response, recovery and percent recovery are provided in Table 2.

TABLE 2

| Ex. | Sensing Comp. | Anneal Temp/Time (° C./min) | QCM Surface | Film Thick. (nm) | Analyte | Response (Hz/ppm) | Recovery (Hz/ppm) | % Recovery* |
|---|---|---|---|---|---|---|---|---|
| 13 | SC-1 | 165/5 | Ti | 58 | Acetone | 0.13480 | 0.13015 | 97% |
| 14 | SC-2 | 225/1 | Cr/Au | 118 | Toluene | 0.47682 | 0.48813 | 102% |
| 15 | SC-3 | 165/2 | Ti | 71 | Triethylamine | 0.04515 | 0.02409 | 53% |
| 16 | SC-4 | 165/5 | Ti | 105 | Triethylamine | 0.0713 | 0.0348 | 49% |
| 17 | SC-5 | 165/1 | Ti | 115 | Pentanethiol | 0.0189 | 0.037 | 196% |
| 18 | SC-6 | 165/1 | Ti | 62 | Triethylamine | 0.03668 | 0.01136 | 31% |
| 19 | SC-6 | 165/1 | Ti | 65 | Acetone | 0.00470 | 0.00079 | 17% |
| 20 | SC-6 | 165/1 | Ti | 65 | Ethanol | 0.00417 | 0.00083 | 20% |
| 21 | SC-7 | 165/1 | Ti | 61 | Triethylamine | 0.10438 | 0.25136 | 241% |
| 22 | SC-8 | 225/2 | Cr/Au | 98 | Toluene | 0.14735 | 0.13996 | 95% |
| 23 | SC-9 | 225/5 | Ti | 118 | Triethylamine | 0.00580 | 0.0014 | 24% |
| 24 | SC-10 | 165/1 | Ti | 390 | Triethylamine | 0.25415 | 0.17333 | 68% |
| 25 | SC-11 | 165/1 | Ti | 58 | Triethylamine | 0.04970 | 0.04318 | 87% |
| 26 | SC-12 | 225/5 | Ti | 118 | Triethylamine | 0.00705 | 0.0029 | 41% |

*Percent recoveries greater than 100% may be a result of one or more of azeotropic analyte removal, changes in humidity before and after dosing, or changes in modulus, e.g., shear and/or elastic as a result of analyte-sensing polymer film interactions.

Examples 28-41

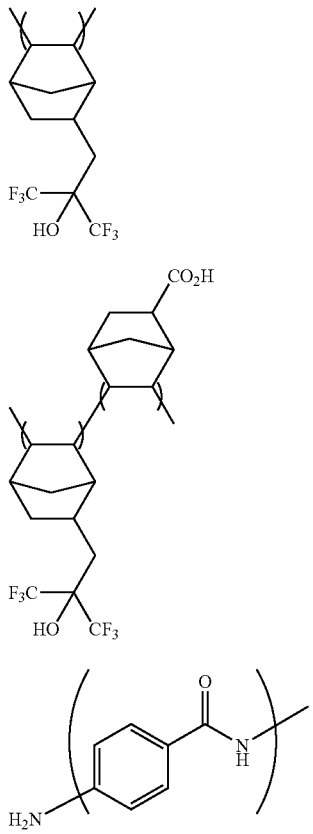

Polymer N

Polymer O

Polymer P

Sensing polymer compositions are prepared by combining polymers and solvents in 20 mL scintillation vials in the weight percentages set forth in Table 3. The mixtures are agitated until a solution forms. The analyte sensing procedure described above is repeated for the following polymers using the conditions set forth in Table 3 for ethanol, triethylamine, acetone and pentanethiol analytes. It is expected that a demonstrable frequency change/response would result for each of the analytes.

What is claimed is:

1. An acoustic wave sensor, comprising:
   a piezoelectric layer;
   first and second electrodes arranged with the piezoelectric layer in a piezoelectric transducer circuit; and
   a polymeric sensing layer for adsorbing a gas-phase analyte, the adsorption of which analyte causes a change in resonant frequency of the piezoelectric transducer circuit, wherein the polymeric sensing layer comprises:

(a) a polymer chosen from substituted or unsubstituted: polyarylenes comprising the reaction product of monomers comprising a first monomer comprising an aromatic acetylene group and a second monomer comprising a cyclopentadienone group; polypyrazoles; or novolacs; or a cured product thereof;

(b) a polymer formed from one or more monomers comprising a monomer comprising a polar group-substituted arylcyclobutene group, or a cured product thereof; or (c) a polymer comprising polymerized units of a monomer chosen from substituted or unsubstituted: maleimides; or norbornenes; or a cured product thereof.

2. The acoustic wave sensor of claim 1, wherein the polymeric sensing layer comprises a polymer chosen from substituted or unsubstituted polyarylenes comprising the reaction product of monomers comprising a first monomer comprising an aromatic acetylene group and a second monomer comprising a cyclopentadienone group, or a cured product thereof.

TABLE 3

| Example | Sensing Composition | Polymer | Solvent | Polymer content (wt %) | Anneal Temp/Time (° C./min) | QCM Surface | Film Thickness (nm) | Analyte |
|---|---|---|---|---|---|---|---|---|
| 27 | SC-13 | N | GBL | 4% | 225/2 | Ti | 100 nm | Ethanol |
| 28 | SC-14 | N | NMP | 4% | 225/2 | Ti | 100 nm | Triethylamine |
| 29 | SC-14 | N | NMP | 4% | 225/2 | Ti | 100 nm | Acetone |
| 30 | SC-15 | N | Anisole | 4% | 225/2 | Ti | 100 nm | Pentanethiol |
| 31 | SC-16 | O | THF | 4% | 225/2 | Ti | 100 nm | Ethanol |
| 32 | SC-16 | O | THF | 4% | 225/2 | Ti | 100 nm | Triethylamine |
| 33 | SC-17 | O | PGMEA | 4% | 225/2 | Ti | 100 nm | Acetone |
| 34 | SC-18 | O | EL | 4% | 225/2 | Ti | 100 nm | Pentanethiol |
| 35 | SC-19 | P | PGMEA | 4% | 225/2 | Ti | 100 nm | Ethanol |
| 36 | SC-19 | P | PGMEA | 4% | 225/2 | Ti | 100 nm | Acetone |
| 37 | SC-20 | P | MBA | 4% | 225/2 | Ti | 100 nm | Triethylamine |
| 38 | SC-21 | P | EL | 4% | 225/2 | Ti | 100 nm | Pentanethiol |

GBL = γ-butyrolactone;
NMP = N-Methyl-2-pyrrolidone;
THF = tetrahydrofuran;
PGMEA = Propylene glycol monomethyl ether acetate;
EL = Ethyl lactate;
MBA = 3-Methoxybutyl Acetate.

3. The acoustic wave sensor of claim 1, wherein the polymeric sensing layer comprises a polymer chosen from substituted or unsubstituted: polypyrazoles; or novolacs; or a cured product thereof.

4. The acoustic wave sensor of claim 1, wherein the polymeric sensing layer comprises a polymer formed from one or more monomers comprising a monomer comprising a polar group-substituted arylcyclobutene group, or a cured product thereof.

5. The acoustic wave sensor of claim 1, wherein the polymeric sensing layer comprises a polymer comprising polymerized units of a monomer chosen from substituted or unsubstituted: maleimides; or norbornenes; or a cured product thereof.

6. The acoustic wave sensor of claim 1, wherein the acoustic wave sensor is a quartz crystal microbalance sensor, a film bulk acoustic resonator, or a surface acoustic wave sensor.

7. A method of sensing a gas-phase analyte, comprising:
   (a) providing an acoustic wave sensor according to any of claims 1;
   (b) exposing the polymeric sensing layer to an atmosphere comprising a gas-phase analyte; and
   (c) monitoring resonant frequency of the acoustic wave sensor in response to the presence of the gas-phase analyte on the polymeric sensing layer.

8. The method of claim 7, further comprising, in sequence:
   (d) exposing the sensor to a second atmosphere effective to reduce the content of the gas-phase analyte in the sensor;
   (e) allowing the resonant frequency of the acoustic wave sensor to recover to a baseline frequency; and
   (f) exposing the sensor to a third atmosphere comprising a gas-phase analyte;
   wherein the step (d), (e), and (f) sequence is performed one or more times.

9. The method of claim 7, wherein the gas-phase analyte is an organic material.

10. The method of claim 7, wherein the gas-phase analyte is chosen from one or more of toluene, ethanol, formaldehyde, acetaldehyde, acetone, acetic acid, or a trialkylamine.

11. The method of claim 7, wherein the gas-phase analyte is chosen from an alkyl thiol or hydrogen sulfide.

12. The method of claim 7, wherein the polymeric sensing layer comprises a polymer chosen from substituted or unsubstituted polyarylenes comprising the reaction product of monomers comprising a first monomer comprising an aromatic acetylene group and a second monomer comprising a cyclopentadienone group, or a cured product thereof.

13. The method of claim 7, wherein the polymeric sensing layer comprises a polymer chosen from substituted or unsubstituted: polypyrazoles; or novolacs;
   or a cured product thereof.

14. The method of claim 7, wherein the polymeric sensing layer comprises a polymer formed from one or more monomers comprising a monomer comprising a polar group-substituted arylcyclobutene group, or a cured product thereof.

15. The method of claim 7, wherein the polymeric sensing layer comprises a polymer comprising polymerized units of a monomer chosen from substituted or unsubstituted: maleimides; or norbornenes; or a cured product thereof.

16. The method of claim 7, wherein the acoustic wave sensor is a quartz crystal microbalance sensor, a film bulk acoustic resonator, or a surface acoustic wave sensor.

* * * * *